(12) United States Patent
Sakuma et al.

(10) Patent No.: US 7,597,821 B2
(45) Date of Patent: *Oct. 6, 2009

(54) OXYNITRIDE PHOSPHOR AND A LIGHT EMITTING DEVICE

(75) Inventors: Ken Sakuma, Sakura (JP); Naoki Kimura, Sakura (JP); Naoto Hirosaki, Tsukuba (JP)

(73) Assignees: Fujikura Ltd., Tokyo (JP); National Institute For Materials Science, Ibaraki (JP)

( * ) Notice: Subject to any disclaimer, the term of this patent is extended or adjusted under 35 U.S.C. 154(b) by 465 days.

This patent is subject to a terminal disclaimer.

(21) Appl. No.: 11/212,559

(22) Filed: Aug. 29, 2005

(65) Prior Publication Data

US 2007/0246732 A1 Oct. 25, 2007

(30) Foreign Application Priority Data

Aug. 30, 2004 (JP) .............................. P2004-250468

(51) Int. Cl.
*H01L 33/00* (2006.01)

(52) U.S. Cl. .............................. 252/301.4 F; 313/503; 257/98

(58) Field of Classification Search ........... 252/301.4 F; 313/503; 257/98
See application file for complete search history.

(56) References Cited

U.S. PATENT DOCUMENTS 7,402,943 B2 * 7/2008 Sakuma et al. .............. 313/503

2005/0285506 A1 * 12/2005 Sakuma et al. .............. 313/503
2006/0061263 A1 * 3/2006 Sakuma et al. .............. 313/503

FOREIGN PATENT DOCUMENTS

| JP | 2002-363554 A | | 12/2002 |
| JP | 2003-124527 A | | 4/2003 |
| JP | 2004-67837 A | | 3/2004 |
| JP | 2004-186278 | * | 7/2004 |
| JP | 2004-186278 A | | 7/2004 |
| JP | 2004-238506 A | | 8/2004 |
| JP | 2004-250468 | | 8/2004 |
| JP | 2005-154611 A | | 6/2005 |

OTHER PUBLICATIONS

J. W. H. van Krevel, et al.: "Luminescence Properties of Terbium-, Cerium-, or Europium-Doped α-Sialon Materials"; Journal of Solid State Chemistry, 165, 2002, p. 19-24.

Rong-Jin Xie, et al., "Eu2+-doped, Ca-α-SiAlON: A yellow phosphor for white light-emitting diodes", Applied Physics Letters, vol. 84, No. 26, Jun. 28, 2004, pp. 5404-5406.

* cited by examiner

*Primary Examiner*—C. Melissa Koslow
(74) *Attorney, Agent, or Firm*—Sughrue Mion, PLLC

(57) ABSTRACT

One preferred embodiment according to the present invention, there is provided an oxynitride phosphor and a light emitting device using the same that is able to reduce production costs and chromaticity shifts. The phosphor is represented by a general formula of $(Ca_{1-z}Y_z)_x(Si, Al)_{12}(O, N)_{16}$:$Eu^{2+}_y$, and has a main phase of substantially an alpha SiAlON crystal structure, wherein the value z is larger than 0 and smaller than 0.15.

14 Claims, 22 Drawing Sheets

| SAMPLE | COMPOSITION DESIGNING | | | | | MIXTURE COMPOSITION (UNIT: % BY MASS) | | | | |
|---|---|---|---|---|---|---|---|---|---|---|
| | x (Ca, Y) | y (Eu) | z (Y SUBSTITUTION RATIO) | m | n | Si₃N₄ | AlN | CaCO₃ | Eu₂O₃ | Y₂O₃ |
| CYE1 | 0.88 | 0.05 | 0% | 1.910 | 0.955 | 66.59 | 18.30 | 13.73 | 1.37 | 0.00 |
| CYE2 | 0.88 | 0.05 | 10% | 1.998 | 0.999 | 65.59 | 19.14 | 12.35 | 1.37 | 1.55 |
| CYE3 | 0.88 | 0.05 | 20% | 2.086 | 1.043 | 64.59 | 19.97 | 10.97 | 1.37 | 3.09 |
| CYE4 | 0.88 | 0.05 | 30% | 2.174 | 1.087 | 63.60 | 20.81 | 9.59 | 1.37 | 4.64 |
| CYE5 | 0.88 | 0.05 | 40% | 2.262 | 1.131 | 62.60 | 21.63 | 8.22 | 1.37 | 6.18 |
| CYE6 | 0.88 | 0.05 | 60% | 2.438 | 1.219 | 60.61 | 23.29 | 5.47 | 1.37 | 9.26 |
| CYE7 | 0.88 | 0.05 | 80% | 2.614 | 1.307 | 58.62 | 24.94 | 2.73 | 1.36 | 12.34 |
| CYE8 | 0.88 | 0.05 | 100% | 2.790 | 1.395 | 56.65 | 26.59 | 0.00 | 1.36 | 15.40 |

FIG. 4

| SAMPLE | COMPOSITION DESIGNING ||||| MIXTURE COMPOSITION (UNIT: % BY MASS) |||||
|---|---|---|---|---|---|---|---|---|---|---|
| | x (Ca, Y) | y (Eu) | z (Y SUBSTITUTION RATIO) | m | n | $Si_3N_4$ | AlN | $CaCO_3$ | $Eu_2O_3$ | $Y_2O_3$ |
| CYE1 | 0.88 | 0.05 | 0% | 1.910 | 0.955 | 66.59 | 18.30 | 13.73 | 1.37 | 0.00 |
| CYE2 | 0.88 | 0.05 | 10% | 1.998 | 0.999 | 65.59 | 19.14 | 12.35 | 1.37 | 1.55 |
| CYE3 | 0.88 | 0.05 | 20% | 2.086 | 1.043 | 64.59 | 19.97 | 10.97 | 1.37 | 3.09 |
| CYE4 | 0.88 | 0.05 | 30% | 2.174 | 1.087 | 63.60 | 20.81 | 9.59 | 1.37 | 4.64 |
| CYE5 | 0.88 | 0.05 | 40% | 2.262 | 1.131 | 62.60 | 21.63 | 8.22 | 1.37 | 6.18 |
| CYE6 | 0.88 | 0.05 | 60% | 2.438 | 1.219 | 60.61 | 23.29 | 5.47 | 1.37 | 9.26 |
| CYE7 | 0.88 | 0.05 | 80% | 2.614 | 1.307 | 58.62 | 24.94 | 2.73 | 1.36 | 12.34 |
| CYE8 | 0.88 | 0.05 | 100% | 2.790 | 1.395 | 56.65 | 26.59 | 0.00 | 1.36 | 15.40 |

FIG. 6

| SAMPLE | SINTERING TEMPERATURE [°C] | PEAK EMISSION WAVELENGTH [nm] | DOMINANT EMISSION WAVELENGTH [nm] | CHROMATICITY COORDINATES | |
|---|---|---|---|---|---|
| | | | | x | y |
| CYE1 | 1700 | 584.6 | 580.24 | 0.5085 | 0.4803 |
| CYE2 | 1700 | 585.6 | 581.22 | 0.5153 | 0.4746 |
| CYE3 | 1700 | 587.2 | 581.99 | 0.5215 | 0.4707 |
| CYE4 | 1700 | 590.6 | 582.82 | 0.5268 | 0.4654 |
| CYE5 | 1700 | 591.4 | 583.14 | 0.5288 | 0.4634 |
| CYE6 | 1700 | 592.6 | 584.03 | 0.5343 | 0.4578 |
| CYE7 | 1700 | 594.4 | 584.33 | 0.5344 | 0.4549 |
| CYE8 | 1700 | 593.2 | 584.66 | 0.5354 | 0.4523 |
| CYE1 | 1800 | 585.4 | 582.54 | 0.5261 | 0.4680 |
| CYE2 | 1800 | 590.8 | 583.09 | 0.5295 | 0.4644 |
| CYE3 | 1800 | 591.0 | 583.65 | 0.5334 | 0.4612 |
| CYE4 | 1800 | 593.2 | 584.68 | 0.5396 | 0.4546 |
| CYE5 | 1800 | 591.6 | 585.13 | 0.5427 | 0.4520 |
| CYE6 | 1800 | 592.8 | 585.36 | 0.5430 | 0.4500 |
| CYE7 | 1800 | 598.6 | 586.39 | 0.5491 | 0.4436 |
| CYE8 | 1800 | 601.4 | 587.53 | 0.5563 | 0.4370 |
| CYE1 | 1900 | 593.2 | 585.21 | 0.5439 | 0.4519 |
| CYE2 | 1900 | 597.6 | 585.76 | 0.5470 | 0.4484 |
| CYE3 | 1900 | 598.4 | 586.43 | 0.5508 | 0.4441 |
| CYE4 | 1900 | 597.8 | 587.42 | 0.5569 | 0.4382 |
| CYE5 | 1900 | 601.2 | 587.99 | 0.5596 | 0.4345 |
| CYE6 | 1900 | 604.4 | 589.39 | 0.5660 | 0.4256 |
| CYE7 | 1900 | 605.6 | 590.68 | 0.5719 | 0.4178 |
| CYE8 | 1900 | 608.0 | 590.38 | 0.5681 | 0.4187 |

FIG. 15

| SAMPLE | PEAK WAVELENGTH [nm] | 3% REDUCTION [nm] | | 5% REDUCTION [nm] | | 10% REDUCTION [nm] | |
|---|---|---|---|---|---|---|---|
| | | SHORTER WAVELENGTHS | LONGER WAVELENGTHS | SHORTER WAVELENGTHS | LONGER WAVELENGTHS | SHORTER WAVELENGTHS | LONGER WAVELENGTHS |
| CYE1 | 449.6 | 439.4 | 456.0 | 432.8 | 463.0 | 407.2 | 471.6 |
| CYE2 | 449.2 | 440.2 | 456.0 | 430.4 | 461.6 | 403.2 | 472.6 |
| CYE3 | 449.0 | 440.4 | 457.8 | 434.2 | 464.2 | 415.2 | 474.6 |
| CYE4 | 449.2 | 441.2 | 457.8 | 435.8 | 463.2 | 411.8 | 477.2 |
| CYE5 | 447.6 | 438.6 | 463.2 | 434.4 | 468.4 | 411.4 | 484.2 |
| CYE6 | 448.4 | 440.2 | 460.6 | 434.2 | 467.8 | 414.2 | 481.4 |
| CYE7 | 449.0 | 410.2 | 457.4 | 402.8 | 461.2 | 391.6 | 470.0 |
| CYE8 | 438.6 | 407.6 | 453.4 | 401.4 | 458.0 | 388.6 | 467.8 |

OXYNITRIDE PHOSPHOR AND A LIGHT EMITTING DEVICE

CROSS REFERENCE TO RELATED APPLICATION

This application claims the benefit of priority under 35 U.S.C. § 119 to Japanese Patent Application No. 2004-250468, filed on Aug. 30, 2004, the entire content of which is incorporated by reference herein.

BACKGROUND OF THE INVENTION

1. Field of the Invention

The present invention relates to an oxynitride phosphor and a light emitting device using the same.

2. Description of the Related Art

In a field of general illumination, a solid-state illumination, specifically, a white light illumination using a semiconductor light emitting diode has attracted a lot of attention and thus researches and developments have been widely and vigorously performed.

Such a white light emitting diode lamp (light emitting device) has already acquired a luminous efficiency comparable or superior to that of an incandescent lamp, even though the diode lamp is still in the process of development. In the near future, the white light emitting diode lamp is thought to become widely used as energy-saving illumination equipment.

In addition, the white light emitting diode lamp is able to reduce an influence on environment since it is free of substances that impose a heavy burden on the environment, such as mercury or the like.

Moreover, the diode lamp has so small a size that it is quite often used as a backlight source of a liquid crystal display apparatus or the like and built-in in a cellular phone or the like.

The mainstream white light emitting diode lamp is fabricated by combining a blue light emitting diode chip and a Europium-activated Ca-alpha-SiAlON phosphor (See, for example, Japanese Patent Application Laid-open Publication No. 2002-363554 for the phosphor, and Japanese Patent Application Laid-open Publication No. 2003-124527 for the lamp).

FIG. 1 illustrates excitation and emission spectra of $Ca_{0.88}Si_{9.135}Al_{2.865}O_{0.955}N_{15.045}:Eu_{0.05}$ as an example of $Eu^{2+}$-activated Ca-alpha-SiAlON phosphor that the inventors of the present invention synthesized for purposes of experiment.

This excitation spectrum was measured with an emission monitoring wavelength of 585 nm using a fluorescence spectrophotometer. The peak excitation wavelength is 449.6 nm.

This excitation spectrum has a wide excitation range in wavelengths shorter than 449.6 nm. Therefore, even when an excitation wavelength shifts toward shorter wavelength from the peak excitation wavelength, only a moderate reduction takes place in excitation efficiency.

On the other hand, a rather abrupt reduction in excitation efficiency takes place in wavelengths longer than 449.6 nm even if the excitation range therein is wide enough compared with that of other phosphors. In other words, the excitation spectrum has a steep slope in the range.

When the aforementioned phosphor is applied to a white light emitting diode lamp, its excitation spectrum is preferably as flat as possible. This is because the white light emitting diode lamp with a flat excitation spectrum is less sensitive to a wavelength shift that may be caused by parameter variations in fabricating a blue light emitting diode chip or temperature changes during use of the blue light emitting diode chip, or the like. Accordingly, only a slight change occurs in chromaticity of such a white light emitting diode lamp.

When the excitation spectrum has a steep slope, an emission intensity of the phosphor is sensitive to a wavelength shift of the excitation wavelength, accordingly leading to a large change in chromaticity of the white light emitting diode lamp.

Such a chromaticity change ends up in a reduction in fabrication yield due to chromaticity variations and causes an adverse influence during use.

Especially, since an emission spectrum of a blue light emitting diode chip generally shifts toward longer wavelengths with an increase in temperature, when the chip having a center emission wavelength of 450 nm that corresponds to the peak excitation wavelength of the phosphor is used, the excitation spectrum has preferably a gentle slope in longer wavelengths.

In other words, there has been desired an alpha-SiAlON of which emission efficiency is improved in wavelengths longer than the peak excitation wavelength in its vicinity.

Also, there has been desired a phosphor that realizes a wider chromaticity range than known phosphors and its chromaticity adjusting technology.

As for a light emitting device for general illumination, various light emitting devices having various color temperatures have been required depending on the application. In order to satisfy such a requirement, there has been desired various phosphors having various chromaticities.

Japanese Patent Application Laid-open Publication No. 2002-363554 discloses that a peak emission wavelength can be varied continuously in a range of from 560 nm to 590 nm by changing an activator amount of $Eu^{2+}$. The phosphor disclosed in Japanese Patent Application Laid-open Publication No. 2003-124527 lies in a range of from 546 nm to 583 nm.

However, there has been required a phosphor that can be excited by blue light and emit light having a further longer wavelength than that of the phosphors disclosed in the above publications.

One example of such a phosphor is disclosed in R-J. Xie et al., "$Eu^{2+}$-doped Ca-alpha-SiAlON: A yellow phosphor for white light-emitting diodes," Applied Physics Letters, Vol. 84, Number 26, pp. 5404-5406 (2004). This phosphor has a chromaticity coordinates of (x, y) from (0.491, 0.497) to (0.560, 0.436) in the CIE1931 color specification system. This means that the dominant emission wavelength is in a range of from 578 nm to 588 nm.

However, regarding a source material for the above phosphor, a very expensive nitride as a source of a solid-solution element is required in addition to silicon nitride and aluminum nitride. For this reason, a longer wavelength phosphor that can be synthesized at a moderate price has been desired.

In view of the above circumstances, the present invention is directed at a provision of an oxynitride phosphor that can reduce chromaticity shifts and production costs, and a light emitting device using the same.

SUMMARY OF THE INVENTION

A first aspect of the present invention provides an oxynitride phosphor represented by a general formula of $(Ca_{1-z}Y_z)_x(Si, Al)_{12}(O, N)_{16}:Eu^{2+}_y$, wherein a main phase thereof has substantially an alpha-SiAlON crystal structure, and wherein the value z is larger than 0 and smaller than 0.15.

A second aspect of the present invention provides an oxynitride phosphor according to the first aspect, wherein the value x is from 0.75 to 1.00 and wherein the value y is from 0.03 to 0.08.

A third aspect of the present invention provides a light emitting device comprising a phosphor according to the first or the second aspect, and a semiconductor blue light emitting diode chip.

A fourth aspect of the present invention provides a light emitting device according to the third aspect, wherein a center emission wavelength of the semiconductor blue light emitting diode chip is from 430 nm to 463 nm.

A fifth aspect of the present invention provides a light emitting device according to the fourth aspect, wherein a center emission wavelength of the semiconductor blue light emitting diode chip is from 440 nm to 456 nm.

A sixth aspect of the present invention provides an oxynitride phosphor represented by a general formula of $(Ca_{1-z}Y_z)_x(Si, Al)_{12}(O, N)_{16}:Eu^{2+}_y$, wherein a main phase thereof has substantially an alpha-SiAlON crystal structure, and wherein the value z is from 0.15 to 0.35.

A seventh aspect of the present invention provides an oxynitride phosphor according to the sixth aspect, wherein the value x is from 0.75 to 1.00 and wherein the value y is from 0.03 to 0.08.

An eighth aspect of the present invention provides a light emitting device comprising a phosphor according to the sixth or the seventh aspect, and a semiconductor blue light emitting diode chip.

A ninth aspect of the present invention provides a light emitting device according to the eighth aspect, wherein a center emission wavelength of the semiconductor blue light emitting diode chip is from 434 nm to 464 nm.

A tenth aspect of the present invention provides a light emitting device according to the ninth aspect, wherein a center emission wavelength of the semiconductor blue light emitting diode chip is from 440 nm to 458 nm.

An eleventh aspect of the present invention provides an oxynitride phosphor represented by a general formula of $(Ca_{1-z}Y_z)_x(Si, Al)_{12}(O, N)_{16}:Eu^{2+}_y$, wherein a main phase thereof has substantially an alpha-SiAlON crystal structure, the value x is from 0.75 to 1.00, the value y is from 0.03 to 0.08, the value z is from 0 to 1.00, the oxynitride phosphor is sintered at a sintering temperature of from 1650 degrees Celsius to 1750 degrees Celsius under a pressurized nitrogen atmosphere, and a dominant emission wavelength is from 580 nm to 585 nm.

A twelfth aspect of the present invention provides an oxynitride phosphor represented by a general formula of $(Ca_{1-z}Y_z)(Si, Al)_{12}(O, N)_{16}:Eu^{2+}_y$, wherein a main phase thereof substantially an alpha-SiAlON crystal structure, the value x is from 0.75 to 1.00, the value y is from 0.03 to 0.08, the value z is from 0 to 1.00, the oxynitride phosphor is sintered at a sintering temperature of from 1750 degrees Celsius to 1850 degrees Celsius under a pressurized nitrogen atmosphere, and a dominant emission wavelength is from 583 nm to 588 nm.

A thirteenth aspect of the present invention provides an oxynitride phosphor represented by a general formula of $(Ca_{1-z}Y_z)_x(Si, Al)_{12}(O, N)_{16}:Eu^{2+}_y$, wherein a main phase of substantially an alpha-SiAlON crystal structure, the value x is from 0.75 to 1.00, the value y is from 0.03 to 0.08, the value z is from 0 to 1.00, the oxynitride phosphor is sintered at a sintering temperature of from 1850 degrees Celsius to 1950 degrees Celsius under a pressurized nitrogen atmosphere, and a dominant emission wavelength is from 585 nm to 590 nm.

A fourteenth aspect of the present invention provides a light emitting device comprising a phosphor according to the eleventh to the thirteenth aspect, and a semiconductor blue light emitting diode chip.

According to the present invention, an oxynitride phosphor and a light emitting device that is able to restrain fabrication costs and to reduce chromaticity variations.

BRIEF DESCRIPTION OF THE DRAWINGS

In the accompanying drawings:

FIG. 4 is a table listing designed compositions of alpha-SiAlON phosphor and mixture compositions of source materials;

FIG. 6 is a table listing peak emission wavelengths, dominant emission wavelengths, and chromaticity coordinates of (x, y) in the CIE1931 color specification system, all of which are obtained from measurements of emission spectra;

FIG. 15 is a table listing peak excitation wavelengths and excitation range widths in which a given degree of excitation efficiency is maintained;

DESCRIPTION OF THE PREFERRED EMBODIMENTS

Referring to accompanying drawings, preferred embodiments according to the present invention will be described in detail. While the following embodiments are intended only for purposes of describing the present invention and are not intended to limit the scope of the invention. Therefore, whereas those skilled in the art can devise various types of embodiments including each and all elements, all the embodiments fall within the scope of the present invention. In addition, in all the drawings used as an aid in describing the following embodiments, identical reference numbers will be used to designate identical or corresponding elements, thereby eliminating unnecessary repetition of description about identical elements.

(Experiment 1)

Figure 2:
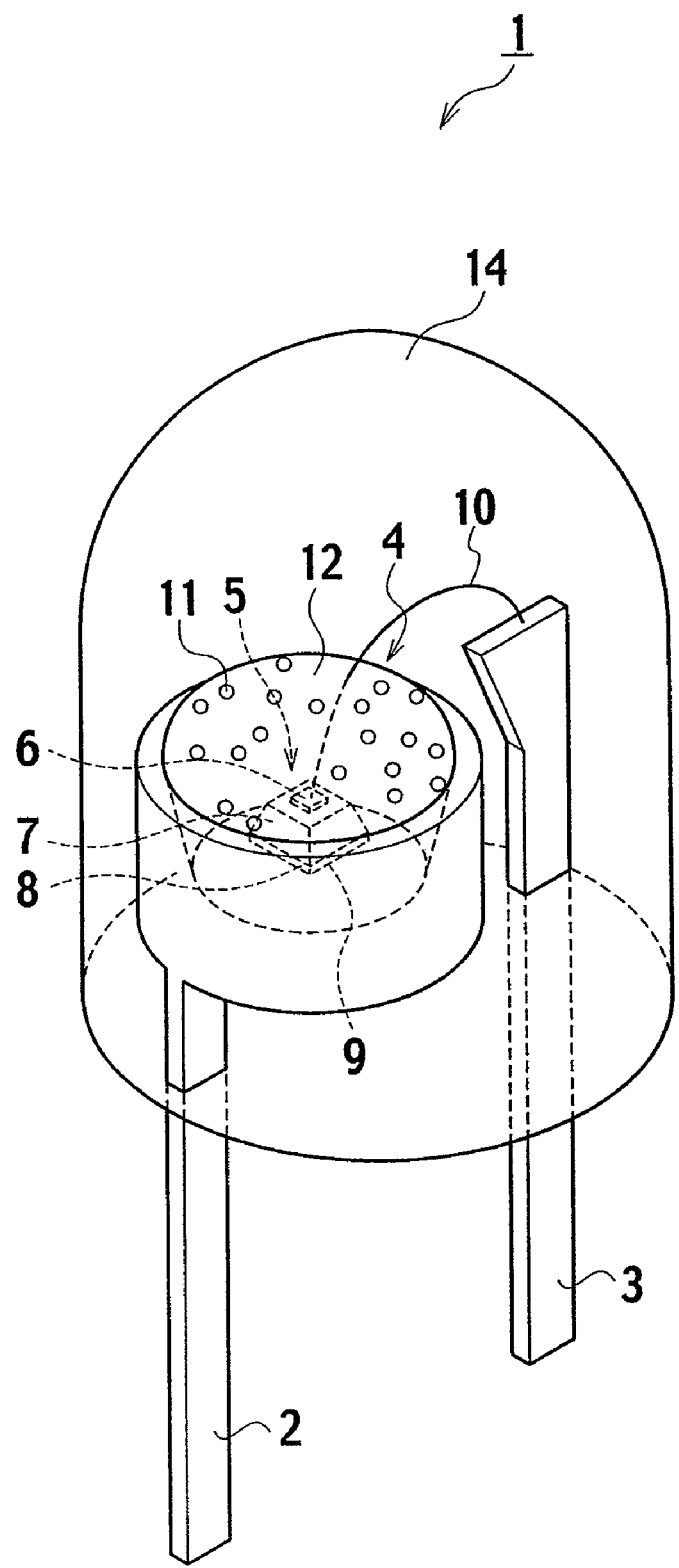
FIG. 2 is a perspective view of an artillery-shell type light emitting diode lamp in a first experiment.
Figure 3:
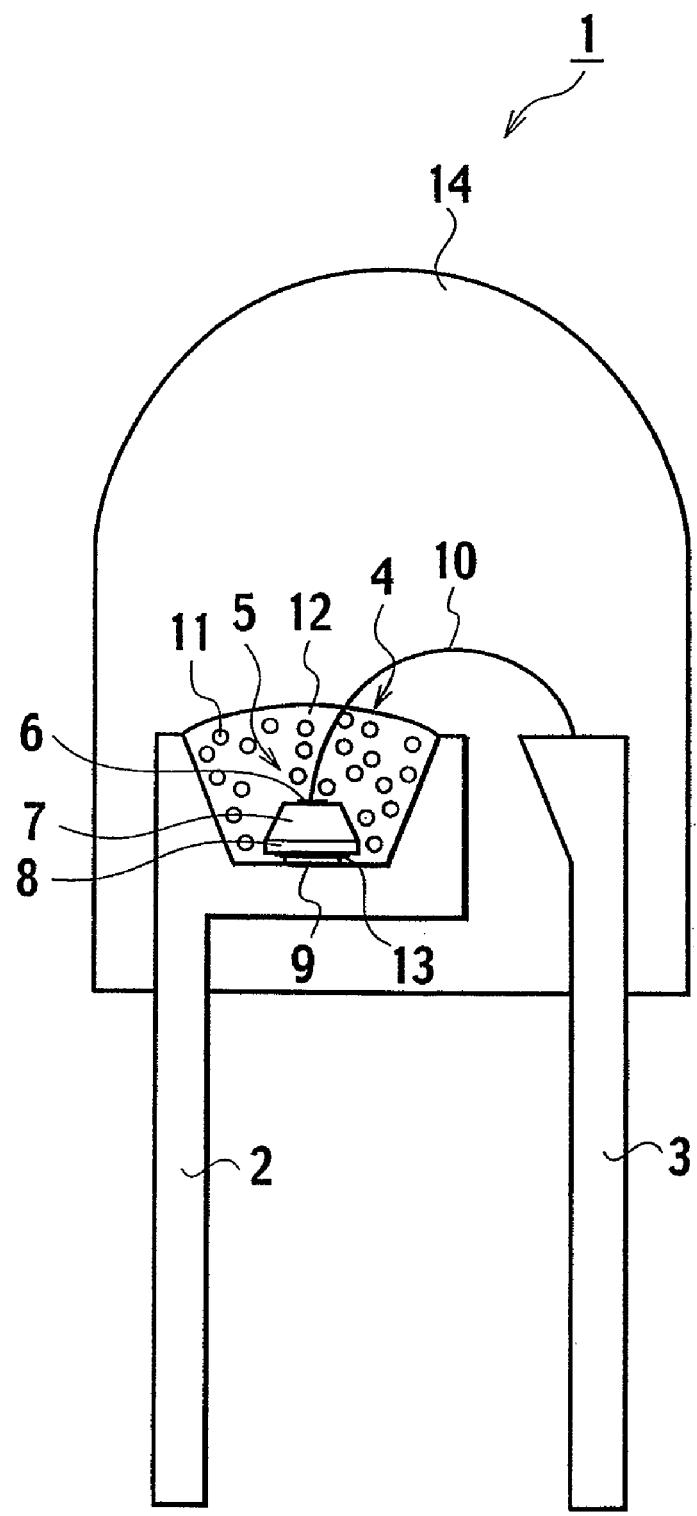
FIG. 3 is a cross section of the artillery-shell type light emitting diode lamp illustrated in FIG. 2.

FIG. 2 illustrates a perspective view of an artillery-shell type light emitting diode lamp (light emitting device) 1 used in a first experiment. FIG. 3 is a cross section of the artillery-shell type light emitting diode lamp 1.

The artillery-shell type light emitting diode lamp 1 has substantially a tubular shape with a sphere serving as a lens at its top, in other words, a shape resembling an artillery shell. The light emitting diode lamp 1 includes lead wires 2, 3, a blue light emitting diode chip (semiconductor blue light emitting diode chip) 5, an electrically conductive paste 9, a metal bonding wire 10 made of gold, a phosphor (oxynitride phosphor) 11, a first resin 12, and a second resin 14.

The blue light emitting diode chip 5 is composed of an upper electrode 6, a silicon carbide (SiC) substrate 7, an indium gallium nitride (InGaN) light emitting layer 8, and a lower electrode 13. In addition, there is provided a cup 4 at the top end of the lead wire 2. The lower electrode 13 of the blue light emitting diode chip 5 is electrically connected to a bottom surface of the cup 4 by the electrically conductive paste 9. The upper electrode 6 is electrically connected to the lead wire 3 by a bonding wire 10.

The first resin 12 is a resin that has transparency, for example, an epoxy resin or the like, and has the phosphor 11 dispersed therein. The first resin 12 fills the cup 4 to seal the blue light emitting diode chip 5.

The above phosphor 11 absorbs part of blue light emitted from the blue light emitting diode chip 5 and emits light (yellow light) having a different wavelength from that of the light from the chip 5. The phosphor 11 will be detailed hereinafter.

The second resin 14 is a resin that has transparency, for example, an epoxy resin or the like, and seals the upper portion of the lead wires 2, 3, the bonding wire 10, and the first resin 12.

The artillery-shell type light emitting diode lamp 1 having the above configuration emits white light obtained by a color mixture of blue light emitted from the blue light emitting diode chip 5 and yellow light emitted from the phosphor 11.

Next, the above phosphor 11 will be described in detail.

In order to solve the above disadvantage, the inventors of the present invention synthesized Eu-activated alpha-SiAlON phosphor of which main phase is an alpha-SiAlON co-doped with Ca and Y and carried out an evaluation of the optical properties thereof.

Japanese Patent Application Laid-open Publication No. 2002-363554 discloses alpha-SiAlON represented by a general formula of $Me_xSi_{12-(m+n)}Al_{(m+n)}O_nN_{16-n}$. Me is Ca, Mg, Y, and lanthanide metals except for La and Ce; lanthanide metals as an emission center such as Ce, Pr, Eu, Tb, Yb, and Er that substitute part of Me: and Dy as their co-activator, according to the publication. When the metal Me is divalent, m is in a range of $0.6<m<3.0$ and n is in a range of $0\leqq n<1.5$, while when the metal Me is trivalent, m is in a range of $0.9<m<4.5$ and n is in a range of $0\leqq n<1.5$ as disclosed in the publication.

The lanthanide metals are 15 elements of La, Ce, Pr, Nd, Pm, Sm, Eu, Gd, Tb, Dy, Ho, Er, Tm, Yb, and Lu.

This is merely a suggestion of a synthesizable composition range of alpha-SiAlON phosphor. Not all optical properties of the individual phosphor are disclosed therein.

Many literatures have reported an alpha-SiAlON having two kinds of elements, that is, one for a solid-solution cation for stabilizing the main phase of alpha-SiAlON, such as Ca or the like, and the other for an activator element to be an emission center, such as Eu or the like. An addition of three elements or more has not been reported except for only a few literatures, one of which is Japanese Patent Application Laid-open Publication No. 2002-363554 that exemplifies $Ca_{0.38}Eu_{0.20}Dy_{0.05}Si_{9.75}Al_{2.25}N_{15.25}O_{0.75}$. Therefore, further researches and progresses have been waited.

The inventors of the present invention synthesized eight kinds of compositions of phosphors listed in FIG. 4. For each composition, the phosphor is sintered at 1700, 1800, and 1900 degrees Celsius. In other words, a total of twenty four samples were prepared.

Next, composition designing will be described. First, an x value representing Ca and Y contents and a y value representing Eu content in the general formula of $(Ca_{1-z}Y_z)_x(Si, Al)_{12}(O, N)_{16}:Eu^{2+}_y$ is determined. It is preferable that the value x is from 0.75 to 1.0 ($0.75\leqq x\leqq 1.0$) and the value y is from 0.03 to 0.08 ($0.03\leqq y\leqq 0.08$).

Second, a z value representing a ratio of Y substituted for Ca is determined assuming that when all the cations are Ca, the z value is 0, whereas all the cations are Y, the z value is 1.

Next, an amount $\{x\times(1-z)\}$ of divalent cation Ca among cations of Ca, Y, and Eu is assumed as j, and an amount $(x\times z+y)$ of trivalent Y and trivalent Eu among cations of Ca, Y and Eu is assumed as k. Then, $(2\times j+3\times k)$ and $(2\times j+3\times k)/2$ are defined as m and n, respectively.

When designing a composition, Eu is assumed to be trivalent since $Eu_2O_3$ is used as a starting material. However, since Eu can be reduced to be divalent during sintering, the values of m and n are potentially slightly different than designed.

Next, a synthesizing method of alpha-SiAlON phosphor will be described.

As starting materials, alpha-Silicon Nitride ($Si_3N_4$), Aluminum Nitride (AlN), Calcium Carbonate ($CaCO_3$), Europium Oxide ($Eu_2O_3$), and Yttrium Oxide ($Y_2O_3$) were used.

Mass ratios of these starting materials calculated in accordance with the above composition designing are summarized in FIG. 4. Then, the starting materials in powder form were weighed in accordance with the designed composition so that an amount per batch is 30 grams (g) and then mixed. Prior to mixing, a predetermined amount of n-hexane was added to the weighed materials and then the n-hexane-added materials were mixed by a planetary ball mill for 2 hours. The mixed materials were desiccated by a rotary evaporator and then the desiccated materials were pounded well in a mortar. Next, the pounded materials were granulated using a stainless steel test sieve having an aperture size of 125 micrometers to obtain powdered materials having a corresponding grain diameter, which were then charged into a covered container made of Boron Nitride.

Then, the sintering process was carried out for the powder materials in the covered container at a temperature of 1700, 1800, and 1900 degrees Celsius in a 0.5 MPa Nitrogen atmosphere for about 24 hours. Since the powder materials were solidified into a mass after the sintering, the mass was then crushed in order to obtain a powder phosphor sample. The mass after the sintering was easily crushed into powder with an application of only a little force.

A powder X-ray diffraction measurement was carried out for three samples among the 24 powdered phosphor samples in 8 different compositions so obtained, specifically, samples CYE1, CYE5, CYE8 that have been synthesized at a sintering temperature of 1800 degrees Celsius, in order to identify their crystal structure.

Figure 5:
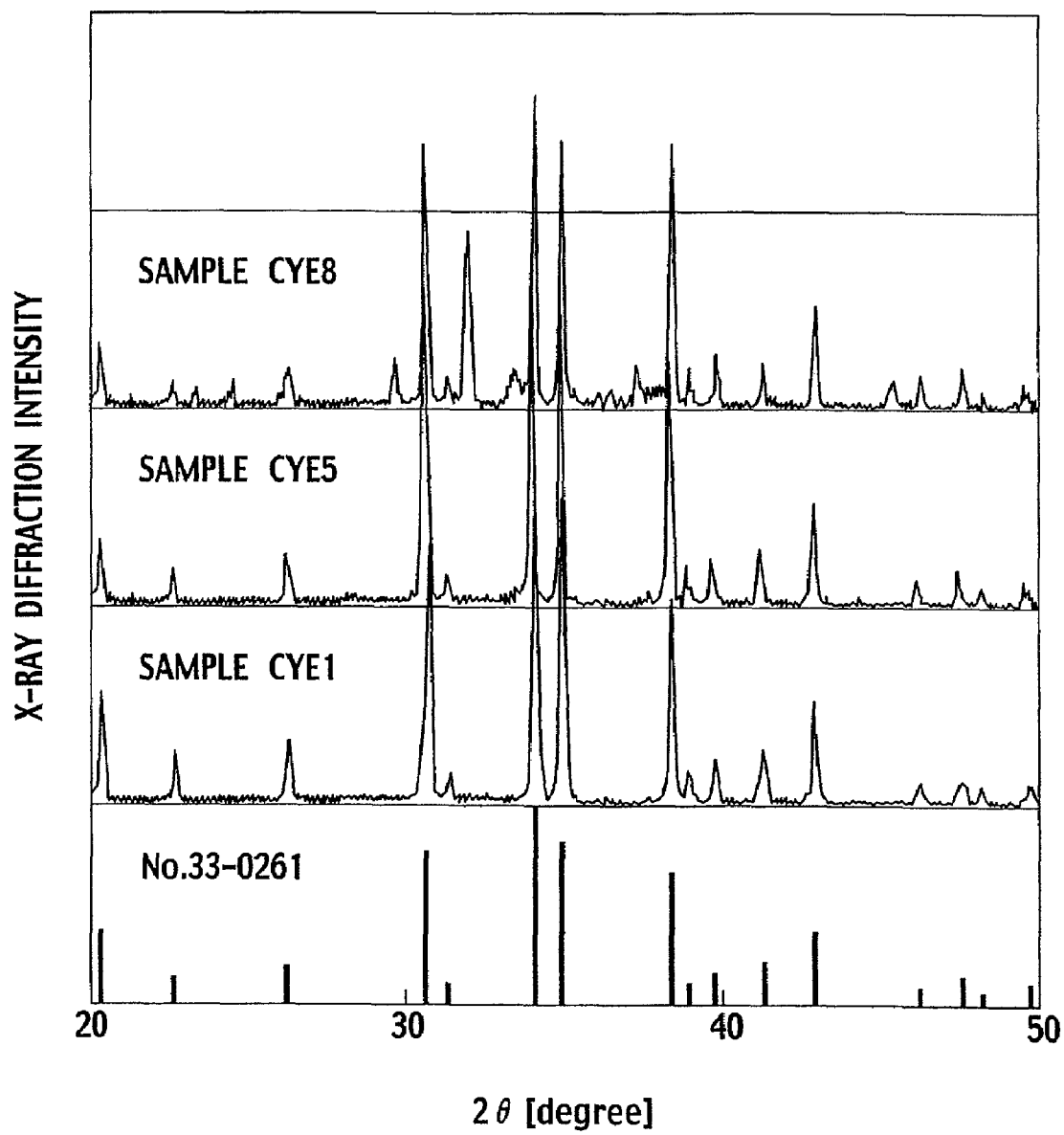
FIG. 5 illustrates an X-ray diffraction pattern of samples.

FIG. 5 illustrates the measurement results of the above powder X-ray diffraction and a peak position corresponding to Ca-alpha-SiAlON, the position being defined in X-ray data card No. 33-0261 of PDF-2 database of JCPDS-ICDD. It has been confirmed from FIG. 5 that the samples CYE1, CYE5 have a single-phase alpha-SiAlON crystal structure and the sample CYE8 has a crystal structure having an alpha-SiAlON structure as a main phase.

Also, excitation and emission spectra of the powder phosphor samples were measured. The measurement was carried out by a fluorescence spectrophotometer for which spectrum correction was conducted using Rhodamine B and a vendor-provided standard light source.

The excitation spectrum was measured with an emission monitoring wavelength set as 585 nm in the fluorescence spectrophotometer. The emission spectrum was measured with an excitation wavelength set as 450 nm in the fluorescence spectrophotometer.

FIG. 6 summarizes the peak emission wavelengths, the dominant emission wavelengths, and the chromaticity coordinates of (x, y) in the CIE1931 color specification system, all of which are obtained by the measurement results of the emission spectra. FIG. 6 shows that as a substitution amount of Y increases or as a sintering temperature increases, the emission wavelength shifts toward longer wavelengths.

The peak emission wavelength of the sample CYE8 sintered at 1900 degrees Celsius shifts to 608.0 nm, while the peak emission wavelength of the sample CYE1 sintered at 1700 degrees Celsius is 584.6 nm.

When the sintering temperature is 1700 degrees Celsius, the dominant emission wavelength of from 580 nm to 585 nm is realized depending on an amount of Y substituted for Ca. When the sintering temperature is 1800 degrees Celsius, the dominant emission wavelength of from 583 nm to 588 nm is realized. When the sintering temperature is 1900 degrees Celsius, the dominant emission wavelength of from 585 nm to 590 nm is realized.

From a comprehensive standpoint, the dominant emission wavelength of the phosphor can be controlled in a wider range of from 580 nm to 590 nm by two parameters of the composition and the sintering temperature.

This shows that the phosphor is capable of emitting light having longer wavelengths than the phosphor disclosed in Japanese Patent Application Laid-open Publications Nos. 2002-363554, 2003-124527 and Xie et. al. and that the novel phosphor can realize a white light emitting device emitting light having a low color temperature which has never been realized, by exciting with a blue light emitting diode chip.

Figure 7:
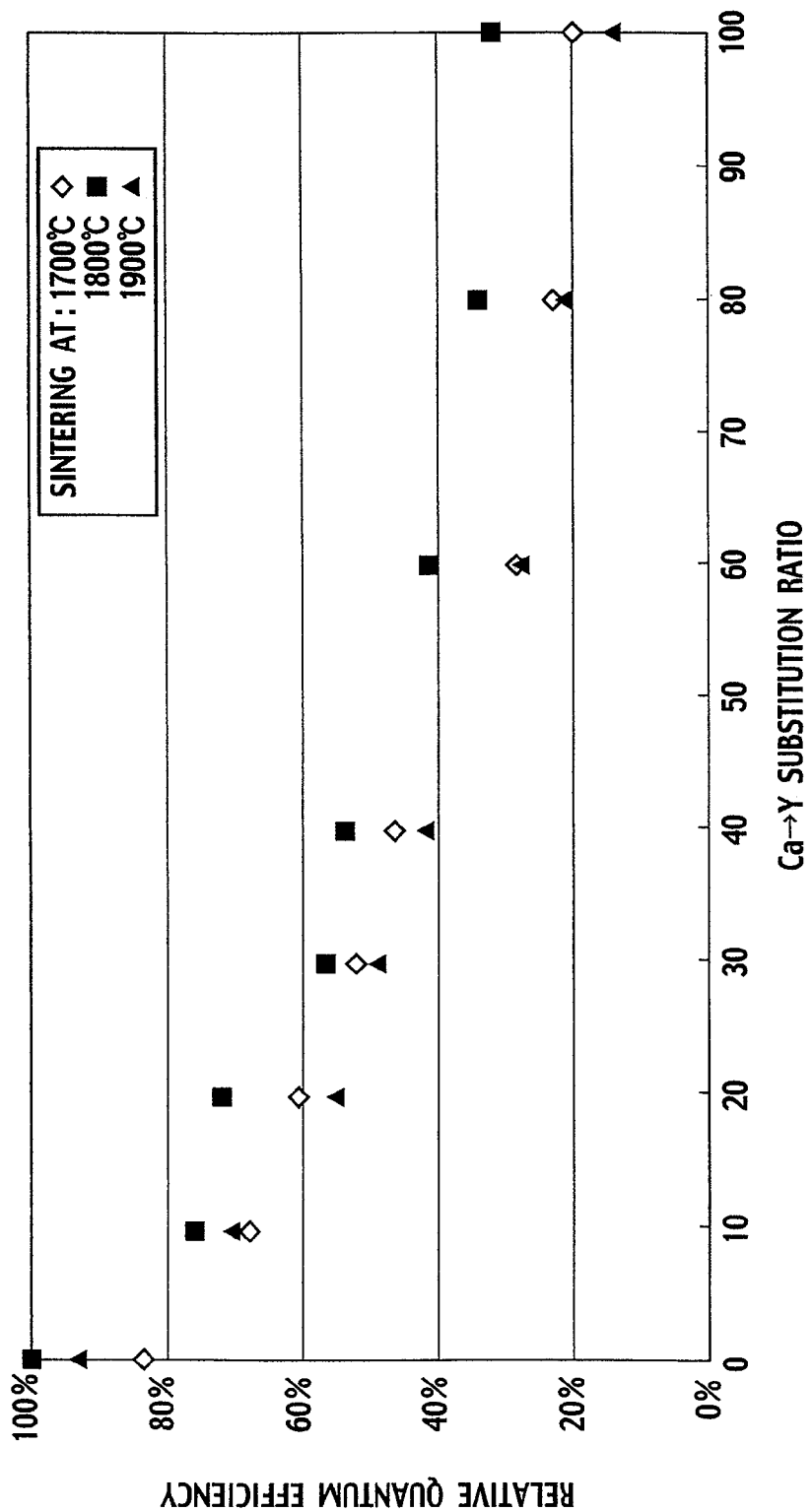
FIG. 7 illustrates a relative quantum efficiency.

FIG. 7 illustrates a relative value of external quantum efficiency obtained by comparing the emission spectrum measured for the samples with an emission spectrum measured for a commercially available $(Y, Gd)_3Al_5O_{12}:Ce^{3+}$ phosphor with a monitoring wavelength of 460 nm, the emission spectra being measured by a fluorescence spectrophotometer.

FIGS. 1, 8 to 14 illustrate normalized measurement results of the excitation and emission spectra measured for the samples sintered at 1800 degrees Celsius by a fluorescence spectrophotometer. In the figures, the excitation and emission spectra are normalized respectively by the peak heights at the peak excitation wavelength and at the peak emission wavelength as reference in order to facilitate a comparison of the spectral shape.

FIG. 15 summarizes the peak excitation wavelength and a width of excitation range in which excitation efficiency is in a given range. The excitation range is defined as a difference between two wavelengths—one is a wavelength at which the excitation efficiency reduces by 3% (5%, 10%) or becomes 97% (95%, 90%) in longer wavelengths, whereas the other is a wavelength at which the excitation efficiency reduces by 3% (5%, 10%) or becomes 97% (95%, 90%) in shorter wavelengths—assuming that the intensity at the peak excitation wavelength is 100%.

Figure 16:
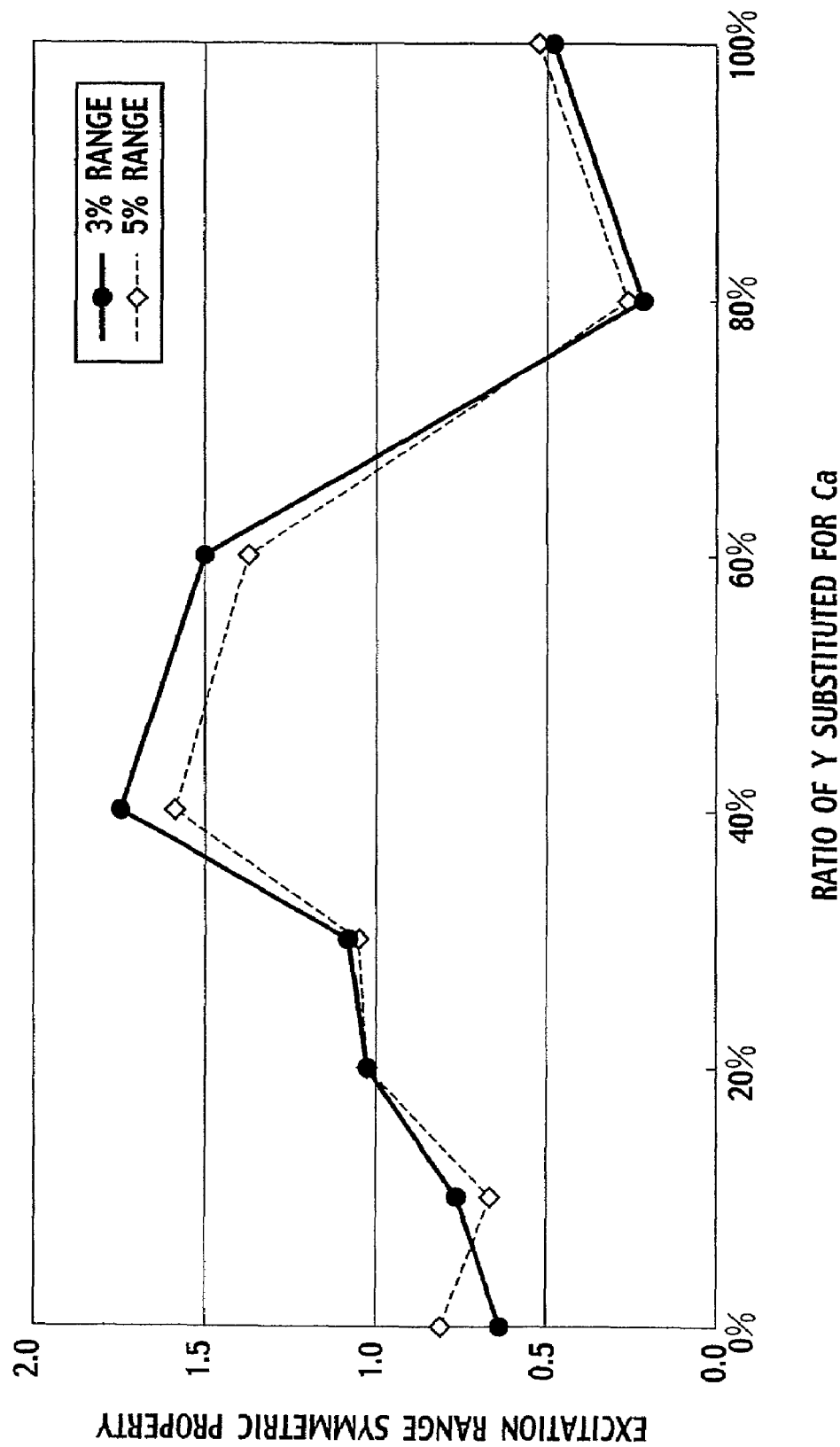
FIG. 16 illustrates a symmetric property of the excitation range widths.

FIG. 16 illustrates a symmetric property of the 3% range as a parameter for investigating an excitation range, the symmetric property being defined as $(\lambda_{97\% \ max} - \lambda_{peak})/(\lambda_{peak} - \lambda_{97\% \ min})$, wherein $\lambda_{peak}$ represents the peak excitation wavelength, $\lambda_{97\% \ min}$ represents a wavelength at which the excitation efficiency reduces by 3% in shorter wavelengths, and $\lambda_{97\% \ max}$ represents a wavelength at which the excitation efficiency reduces by 3% in longer wavelengths.

FIG. 16 also illustrates the values of $(\lambda_{95\% \ max} - \lambda_{peak})/(\lambda_{peak} - \lambda_{95\% \ min})$ as a symmetric property of 5% band.

From FIGS. 15 and 16, it has been found that when an amount of Y substituted for Ca increases, the excitation efficiency in shorter wavelengths reduces until the substitution amount of Y becomes 50%, compared with the excitation efficiency at the peak excitation wavelength, thereby leading to the excitation spectrum in which the excitation efficiency is improved in longer wavelengths.

Specifically, regarding the sample CYE3 having a substitution amount of 20% and the sample CYE4 having a substitution amount of 30%, a value of the symmetric property in FIG. 16 is about 1, which preferably indicates that the excitation efficiency is well balanced in both shorter and longer wavelengths.

Figure 13:
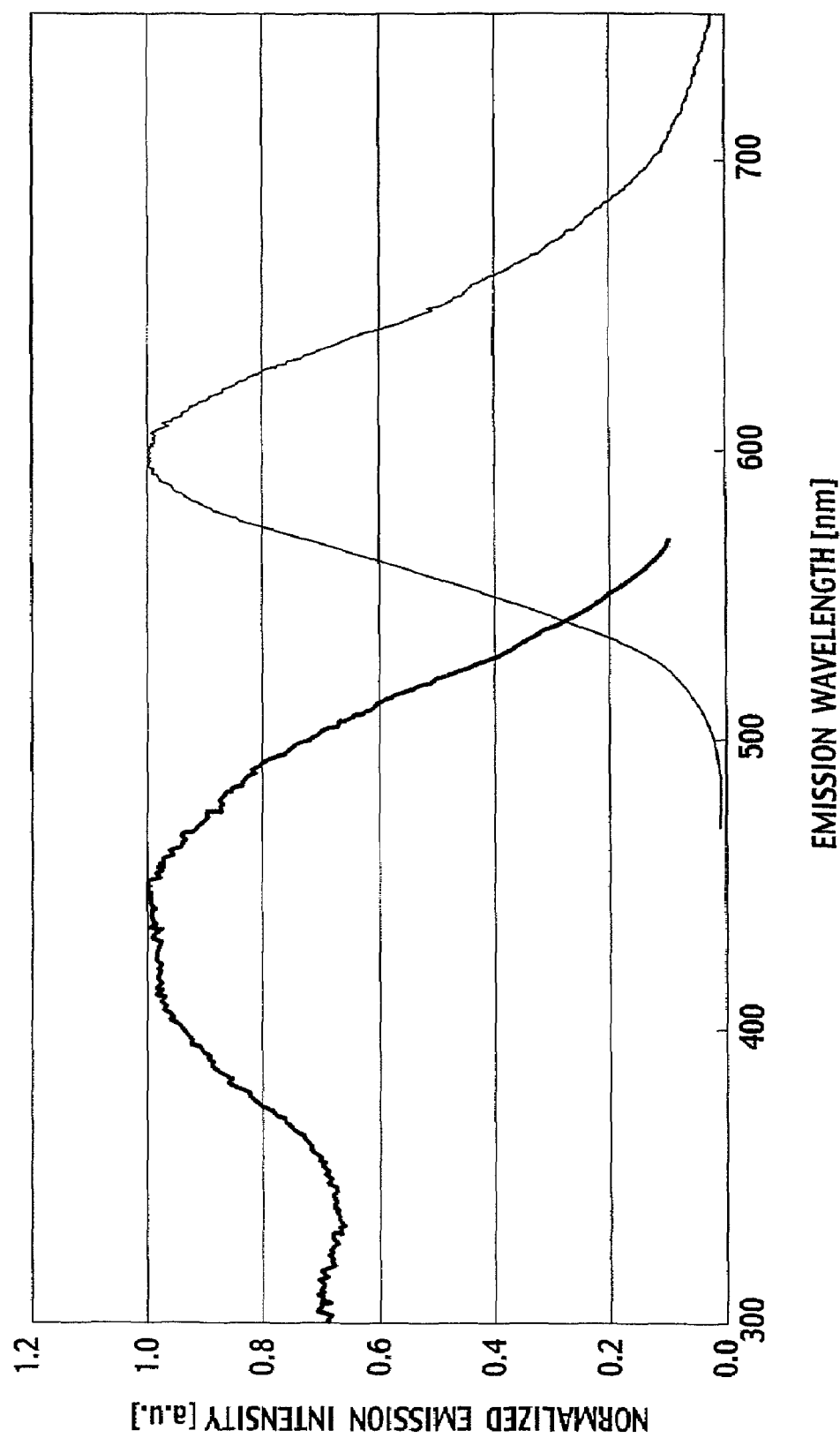
FIG. 13 illustrates excitation and emission spectra of a phosphor obtained by sintering a sample CYE7 at 1800 degrees Celsius.
Figure 14:
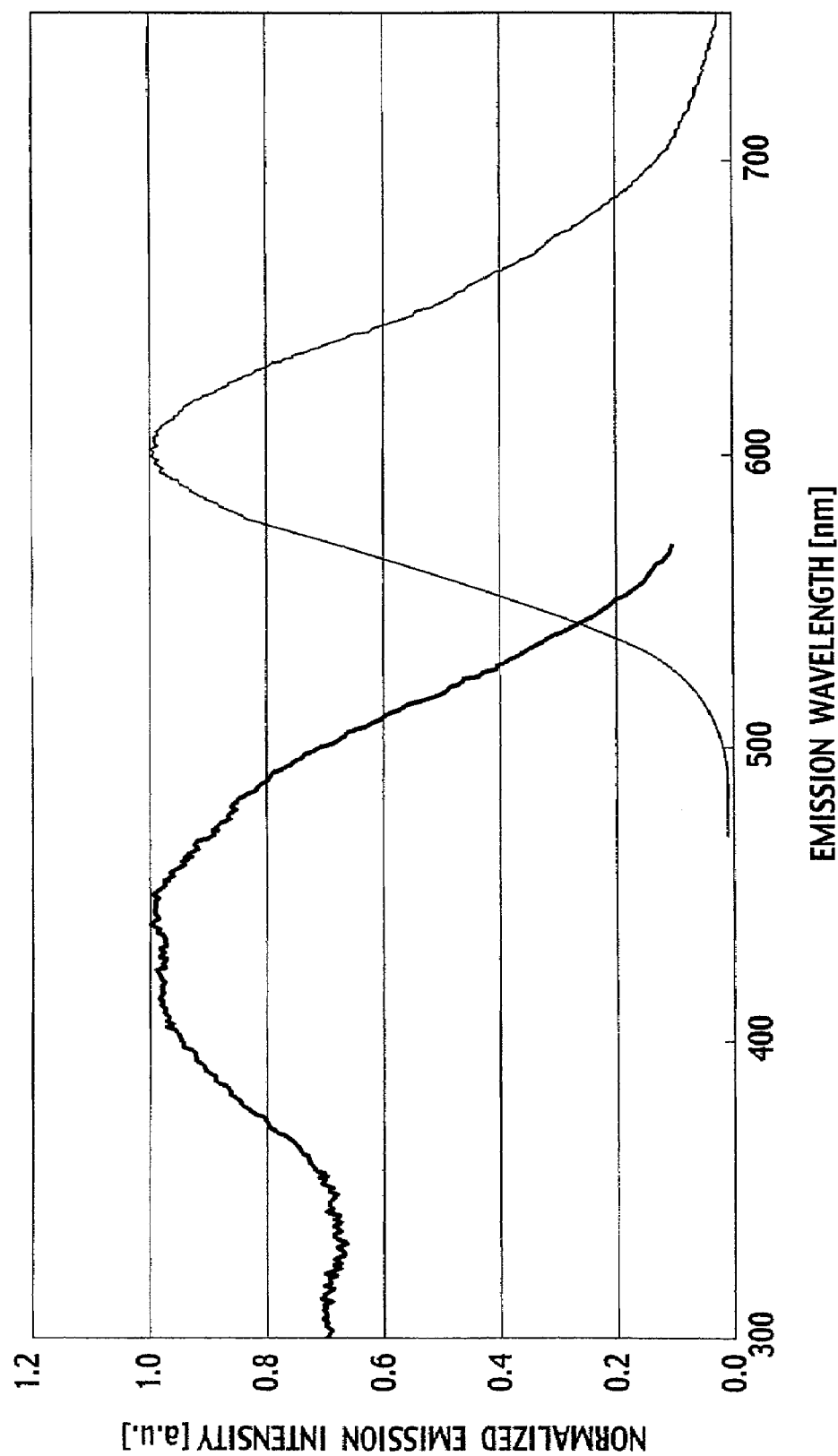
FIG. 14 illustrates excitation and emission spectra of a phosphor obtained by sintering a sample CYE8 at 1800 degrees Celsius.

When the substitution amount of Y is beyond 50%, the excitation efficiency in longer wavelengths reduces again, thereby leading to an improvement in shorter wavelengths. Specifically, the sample CYE7 having a Y amount of 90% and the sample CYE8 having a Y amount of 100% have a slightly different excitation spectra than those of the CYE1 to CYE6 as illustrated in FIGS. 13 and 14. Namely, the excitation efficiency is raised at and around 415 nm.

From the above experiment results, it has been derived that when the excitation efficiency in longer wavelengths needs to be improved in Eu-activated Ca-alpha-SiAlON phosphor with a great importance placed on the emission efficiency, Y is preferably substituted for Ca so that the z value in alpha-SiAlON phosphor represented by the general formula $(Ca_{1-z}Y_z)_x(Si, Al)_{12}(O, N)_{16}:Eu^{2+}_y$ is in a range between 0 and 0.15. When a white light emitting diode lamp is fabricated using such a phosphor, there is obtained a white light emitting diode lamp that has a sufficient emission efficiency and is improved in terms of chromaticity variations caused during fabrication and chromaticity changes caused during use, compared with the conventional ones.

On the other hand, when placing an importance on the insensitivity of phosphor emission efficiency to a shift in excitation wavelength, Y is substituted for Ca so that the z value in alpha-SiAlON phosphor represented by the general formula $(Ca_{1-z}Y_z)_x(Si, Al)_{12}(O, N)_{16}:Eu^{2+}_y$ is in a range of from 0.15 to 0.35, although the emission efficiency is slightly sacrificed. When a white light emitting diode lamp is fabricated using such a phosphor, there is obtained a white light emitting diode lamp that is further improved in terms of chromaticity variations caused during fabrication and chromaticity changes caused during use, compared with the conventional ones.

By the way, the artillery-shell type light emitting diode lamp 1 includes, as the phosphor 11, a phosphor that has the same composition as the sample CYE2 and has been sintered at 1800 degrees Celsius.

Figure 8:
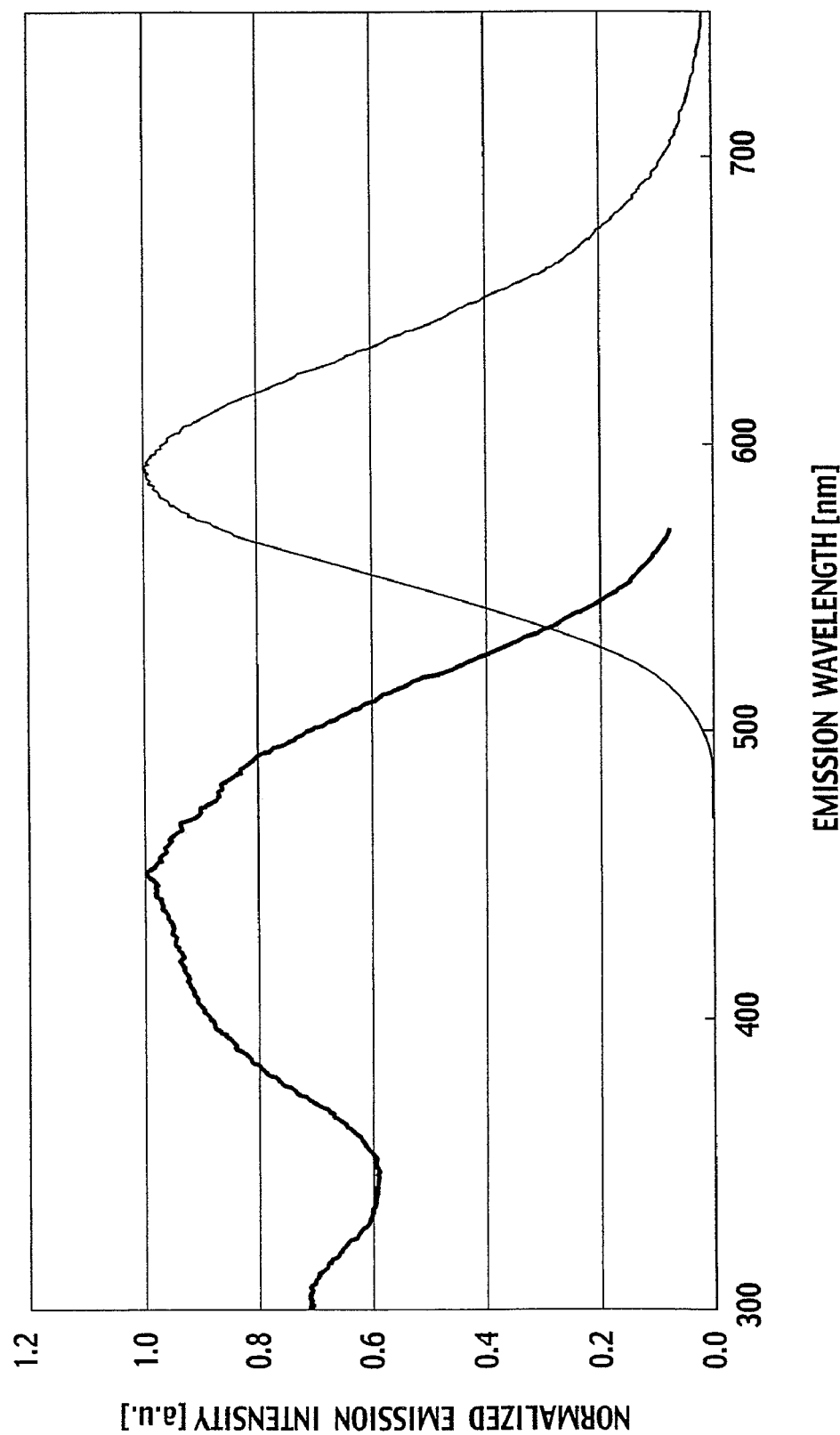
FIG. 8 illustrates excitation and emission spectra of a phosphor obtained by sintering a sample CYE2 at 1800 degrees Celsius.

The excitation and emission spectra of the above phosphor measured by a fluorescence spectrophotometer are as illustrated in FIG. 8. The 3% range width in which the excitation efficiency is 97% or larger of the excitation efficiency at the peak excitation wavelength of 449.2 nm is 9.0 nm in wavelengths shorter than the peak excitation wavelength and 6.8 nm in wavelengths longer than the peak excitation wavelength, which means that this phosphor has better symmetrical property than that of the phosphor described with reference to FIG. 1.

Moreover, the emission efficiency is sufficiently high. The peak emission wavelength is 590.8 nm; the dominant emission wavelength is 583.09 nm; and the chromaticity coordinates of (x, y) in the CIE1931 color specification system are (0.530, 0.464).

Figure 17:
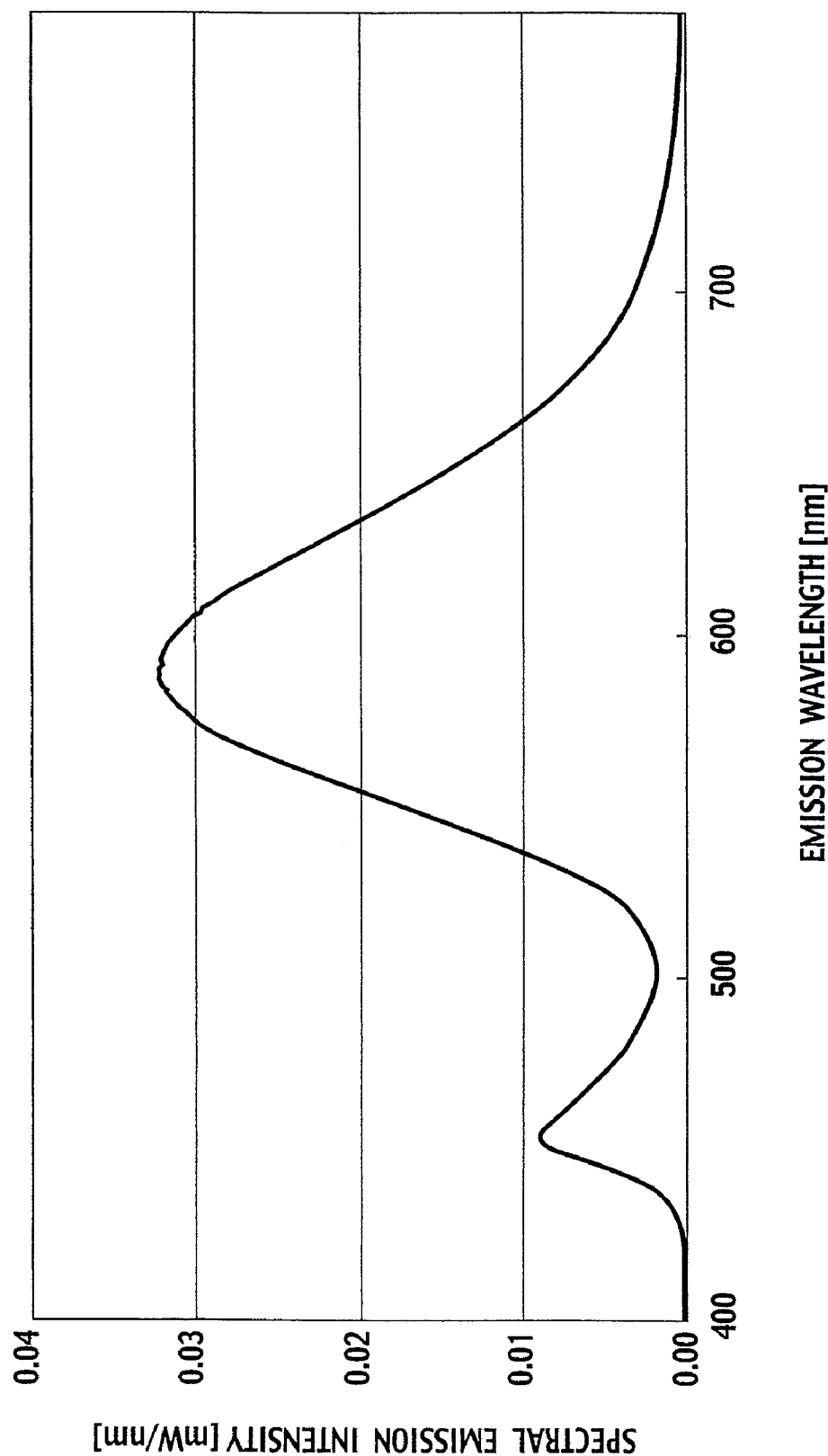
FIG. 17 illustrates an emission spectrum of the light emitting diode lamp in the first experiment.

Additionally, regarding the light emitted from the artillery-shell type light emitting diode lamp 1 including this phosphor 11 in this experiment, the color temperature is 2471 K, the chromaticity coordinates of (x, y) are (0.483, 0.419) in the CIE1931 color specification system, and the emission efficiency is 22.1 1 m/W (lumen per watt). The emission spectrum is as illustrated in FIG. 17.

(Experiment 2)

The experiment 1 describes that the artillery-shell type light emitting diode lamp 1 has, as the phosphor 11, the phosphor that has the same composition as that of the sample CYE2 and has been sintered at 1800 degrees Celsius. However, an experiment 2 describes that the artillery-shell type light emitting diode lamp 1 has, as the phosphor 11, a phosphor that has the same composition as that of the sample CYE4 and has been sintered at 1800 degrees Celsius.

Figure 10:
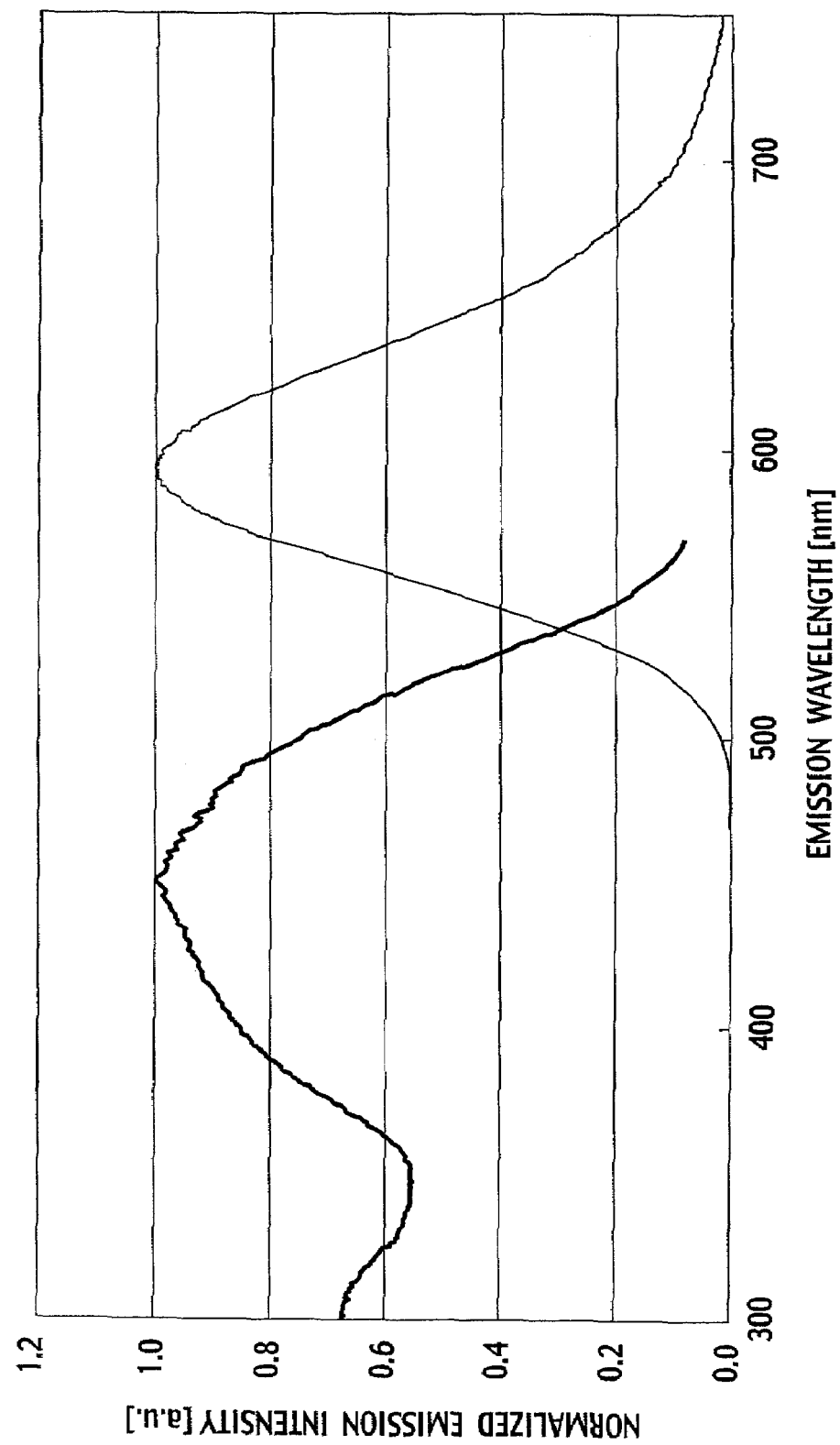
FIG. 10 illustrates excitation and emission spectra of a phosphor obtained by sintering a sample CYE4 at 1800 degrees Celsius.

The excitation and emission spectra of the above phosphor measured by a fluorescence spectrophotometer are as illustrated in FIG. 10. The 3% range width in which the excitation efficiency is 97% or larger of the excitation efficiency at the peak excitation wavelength of 449.2 nm in the excitation spectrum is 8.0 nm in wavelengths shorter than the peak excitation wavelength and 8.6 nm in wavelengths longer than the peak excitation wavelength, which is indicative of an excellent symmetric property.

In addition, the emission efficiency is sufficiently high. The peak emission wavelength is 593.2 nm; the dominant wavelength is 584.68 nm; and the chromaticity coordinates of (x, y) in the CIE1931 color specification system are (0.540, 0.455).

Figure 18:
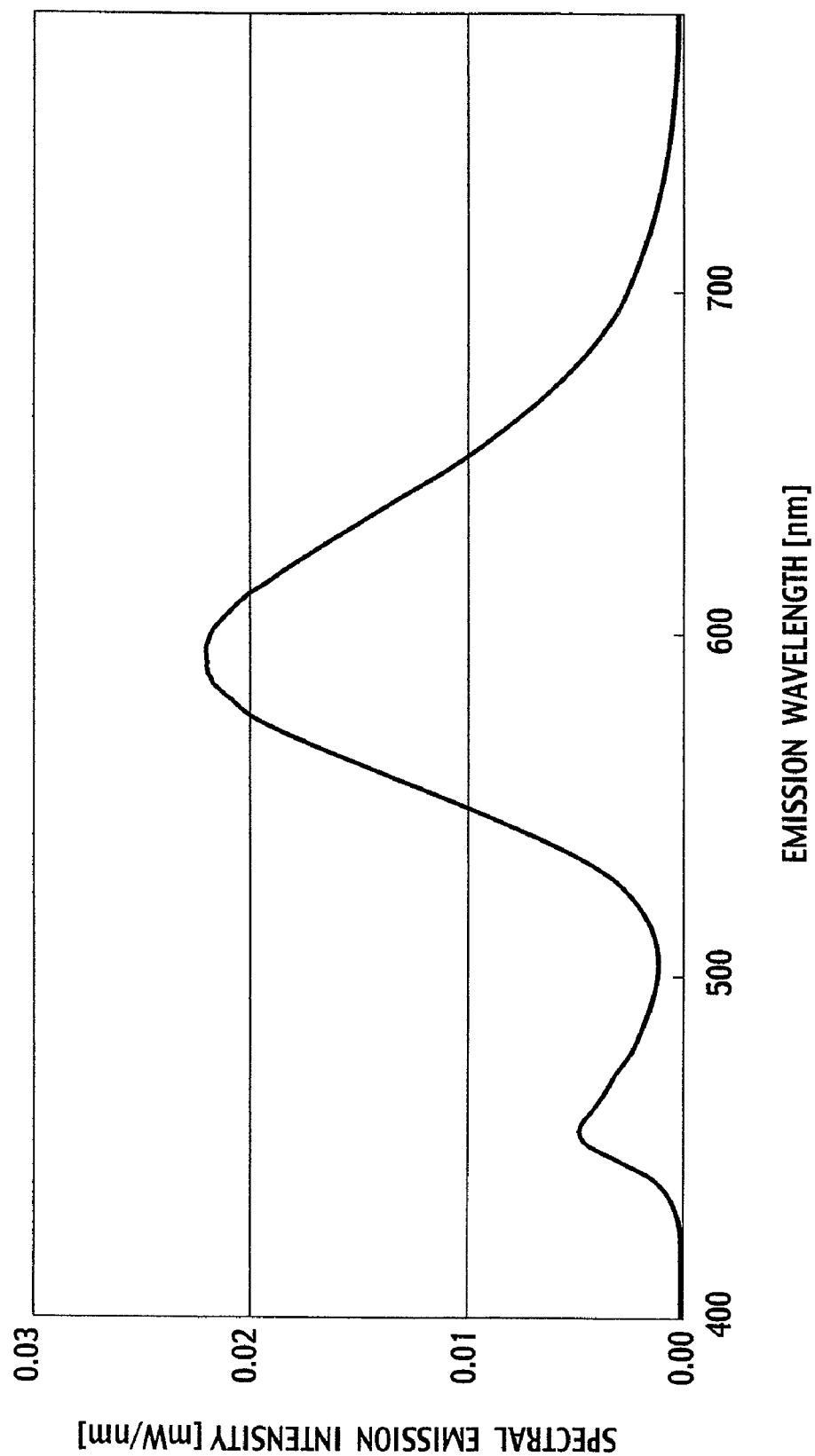
FIG. 18 illustrates an emission spectrum of a light emitting diode lamp in a second experiment.

Additionally, regarding the light emitted from the artillery-shell type light emitting diode lamp 1 including this phosphor 11 in this experiment, the color temperature is 2254 K, the chromaticity coordinates of (x, y) are (0.501, 0.417) in the CIE1931 color specification system, and the emission efficiency is 14.5 1 m/W (lumen per watt). The emission spectrum is as illustrated in FIG. 18.

(Experiment 3)

The experiments 1 and 2 describe that the artillery-shell type light emitting diode lamp 1 has, as the phosphor 11, the phosphor that has the same composition as that of the sample CYE2 and the sample CYE4, respectively, and has been sintered at 1800 degrees Celsius. However, an experiment 3 describes that the artillery-shell type light emitting diode lamp 1 has, as the phosphor 11, a phosphor that has the same composition as that of the sample CYE1 described above and has been sintered at 1800 degrees Celsius.

Figure 1:
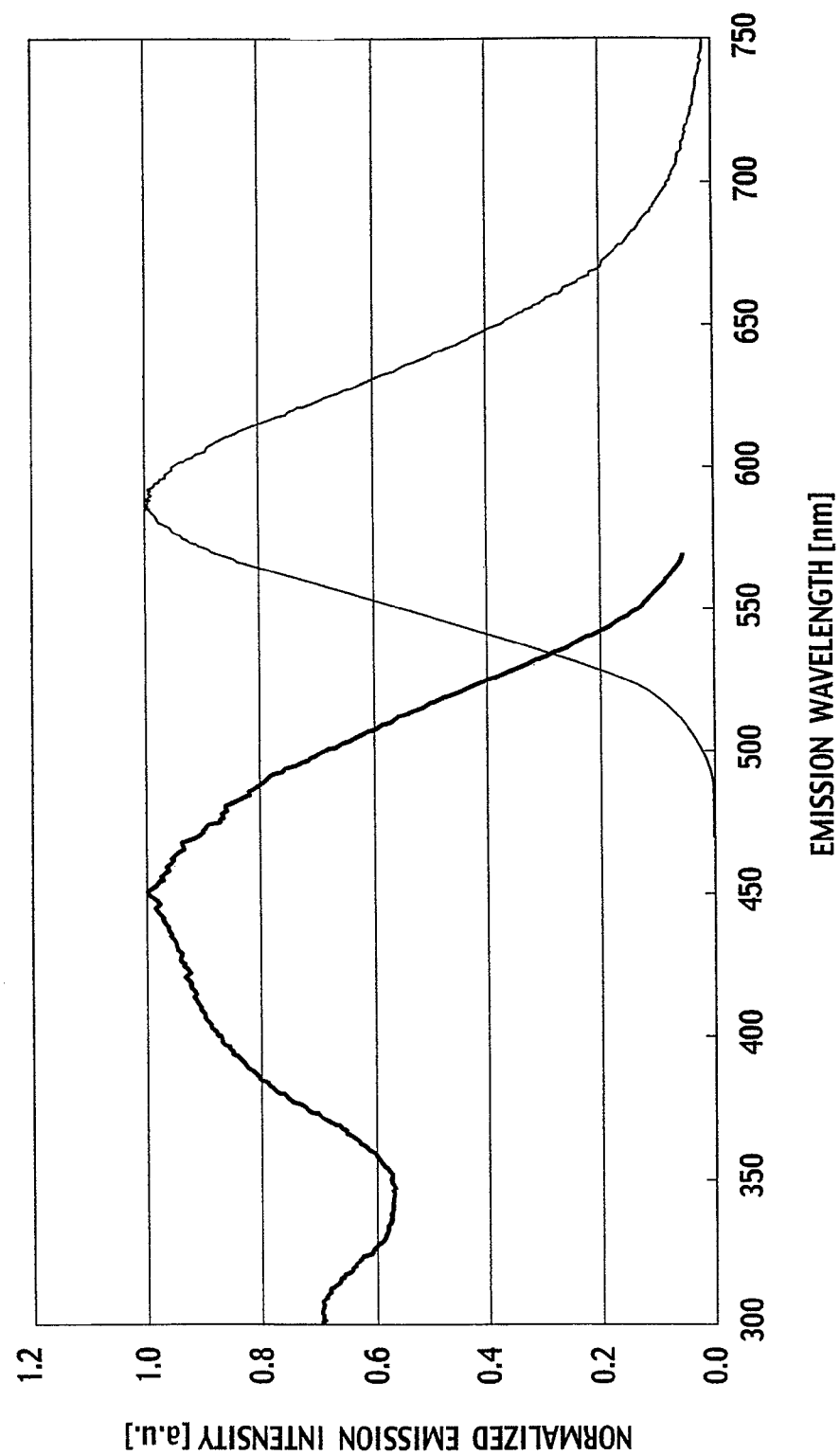
FIG. 1 illustrates excitation and emission spectra of a phosphor obtained by sintering a sample CYE1 at a temperature of 1800 degrees Celsius.

The excitation and emission spectra of the above phosphor measured by a fluorescence spectrophotometer are as illustrated in FIG. 1. The 3% range width in which the excitation efficiency is 97% or larger of the excitation efficiency at the peak emission wavelength of 449.6 nm in the excitation spectrum is 10.2 nm in wavelengths shorter than the peak excitation wavelength and as narrow as 6.4 nm in wavelengths longer than the peak excitation wavelength.

In addition, the peak emission wavelength is 585.4 nm; the dominant emission wavelength is 582.54 nm; and the chromaticity coordinates of (x, y) in the CIE1931 color specification system are (0.526, 0.468).

Figure 19:
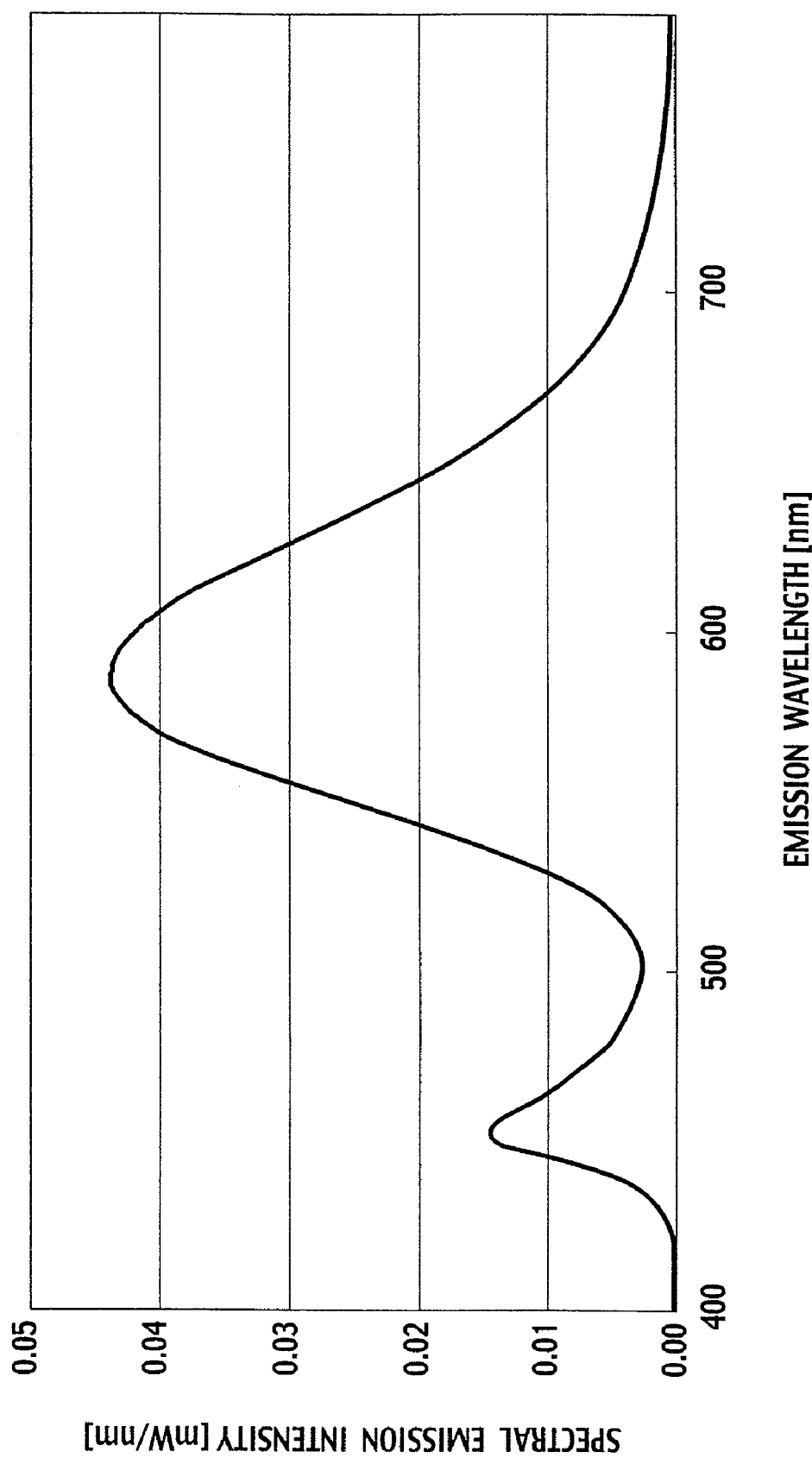
FIG. 19 illustrates an emission spectrum of a light emitting diode lamp in a third experiment.

Additionally, regarding the light emitted from the artillery-shell type light emitting diode lamp 1 including this phosphor 11 in this experiment, the color temperature is 2586 K, the chromaticity coordinates of (x, y) are (0.473, 0.418) in the CIE1931 color specification system, and the emission efficiency is 30.6 1 m/W (lumen per watt). The emission spectrum is as illustrated in FIG. 19.

(Experiment 4)

Figure 20:
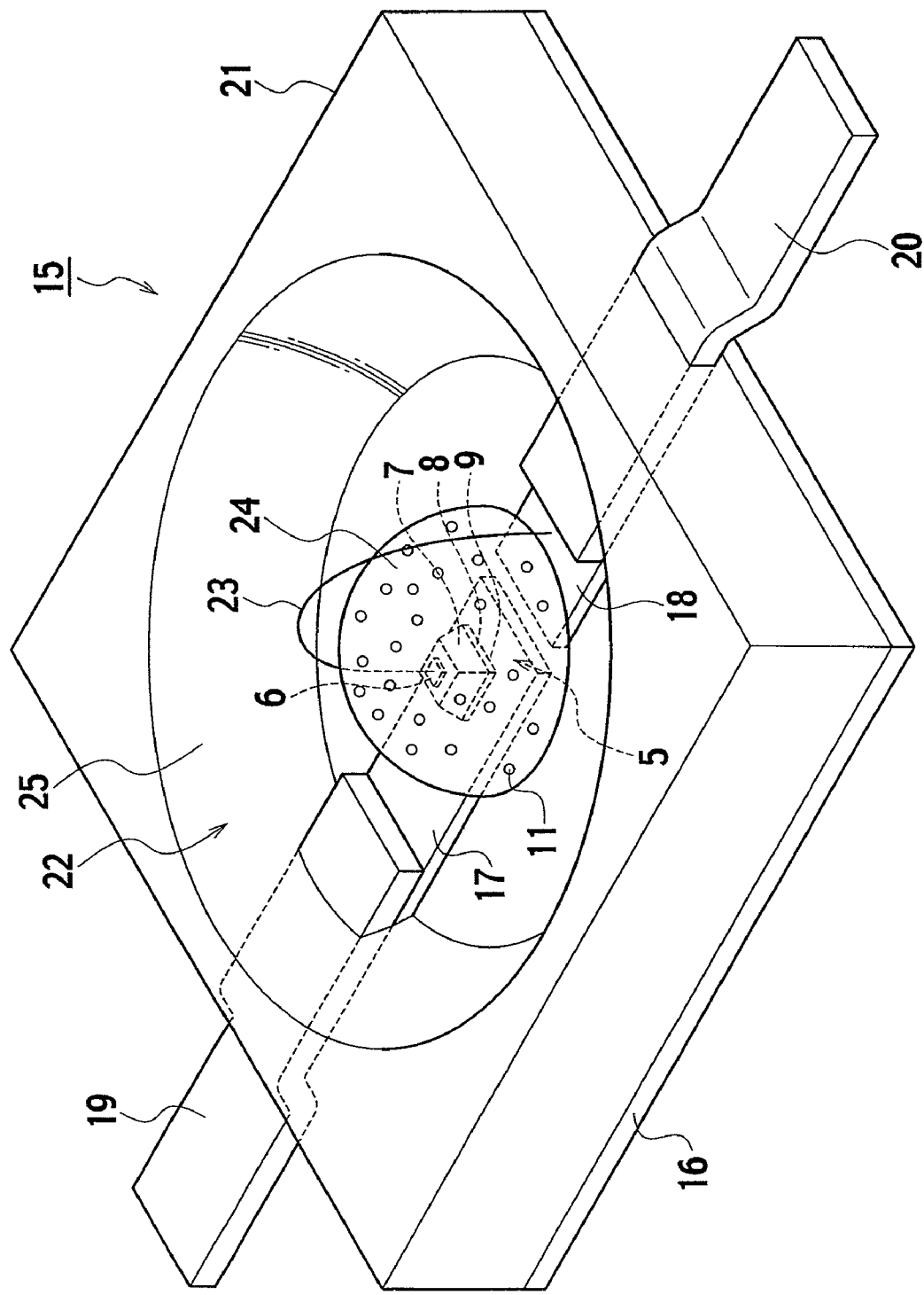
FIG. 20 is a perspective view of a chip-type light emitting diode lamp in a fourth experiment.
Figure 21:
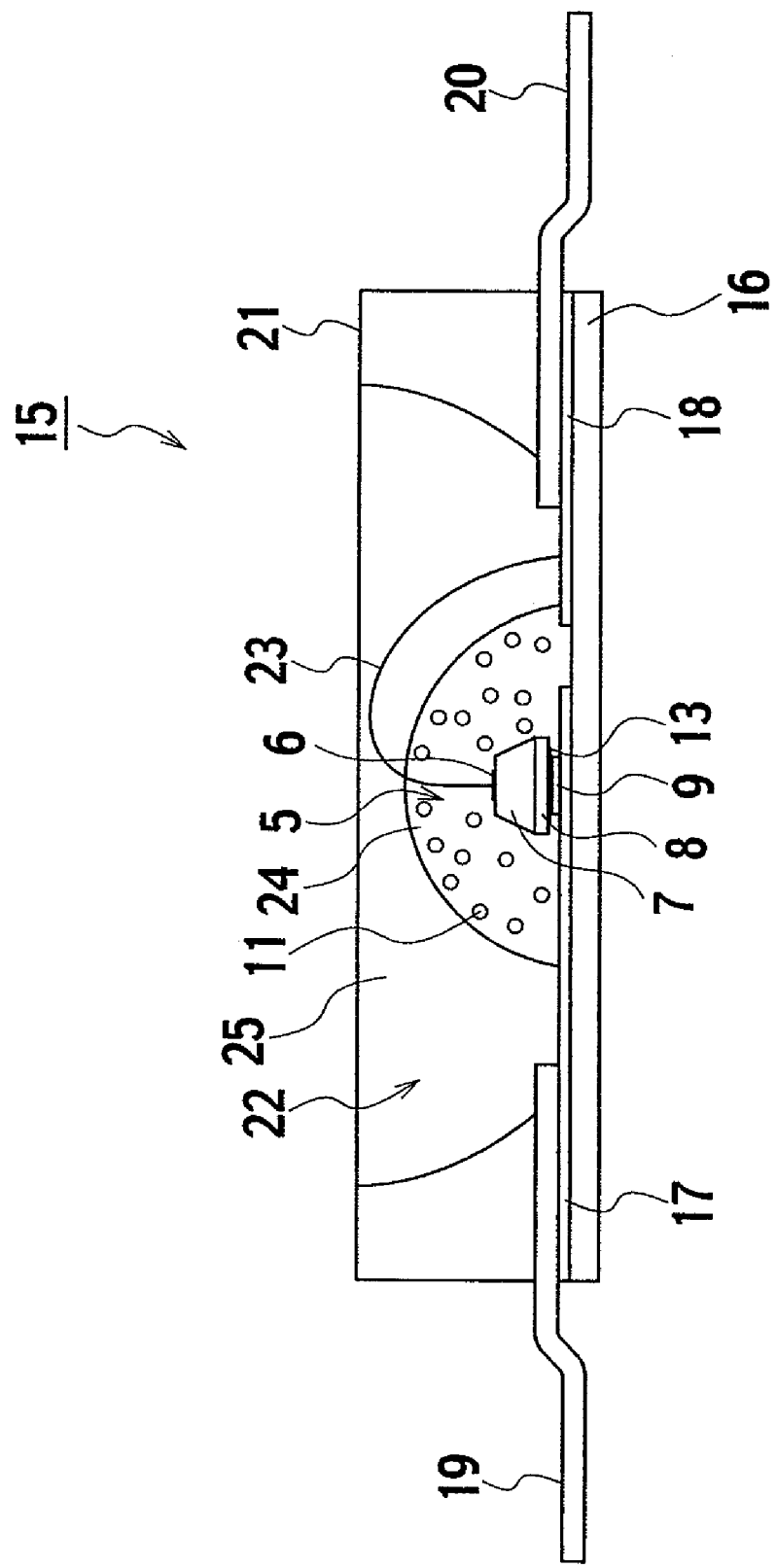
FIG. 21 is a cross section of the chip-type light emitting diode lamp illustrated in FIG. 20.

FIG. 20 illustrates a perspective view of a chip-type light emitting diode lamp (light emitting device) 15 to be used in a fourth experiment. FIG. 21 illustrates a cross section of the chip-type light emitting diode lamp 15.

The chip-type light emitting diode lamp 15 is composed of a blue light emitting diode chip (semiconductor blue light emitting diode chip) 5, a phosphor (oxynitride phosphor) 11, a supporting substrate 16, electrode patterns 17, 18, lead wires 19, 20, a side face member 21, a bonding wire 23, a first resin 24, and a second resin 25.

The supporting substrate 16 has a quadrangular shape and is made from a material having a high reflectivity of visible light, such as alumina ceramics.

On a front face of the supporting substrate 16, the two electrode patterns 17, 18 are formed by sputtering. The electrode patterns 17, 18 are several micron thick, thereby leaving almost no step between the supporting substrate 16 and these electrode patterns 17, 18.

To the electrode pattern 17 is connected the lead wire 19 by a high-melting point solder or the like, whereas the electrode pattern 18 is connected to the lead wire 20 by a high-melting point solder or the like.

The end portion of the electrode pattern 17 is situated in the center of the supporting substrate 16. On the end portion is placed and fixed the blue light emitting diode chip 5.

By the way, a lower electrode 13 and the electrode pattern 17 are electrically connected with each other by electrically conductive paste.

In addition, an upper electrode 6 and the other electrode pattern 18 are electrically connected by a bonding wire 23.

The first resin 24 is a resin that has transparency, such as an epoxy resin or the like, and the phosphor 11 is dispersed therein. The first resin 24 seals the blue light emitting diode chip 5.

In addition, the side face member 21 having a space portion 22 in the center thereof is fixed on the supporting substrate 16.

The space portion 22 is to house the blue light emitting diode chip 5 and the first resin 24 having the phosphor 11 dispersed therein. The inner face of the space portion 22 is sloped so as to serve as a reflection surface for reflecting light upward (frontward). The shape of the inner face is determined taking account of the reflection angle of the light.

In addition, at least the face serving as the reflection surface is formed of a material having a high reflectivity of visible light and having a white color or metallic luster. In this experiment, the side face member 21 is made of a white silicone resin.

The second resin 25 is a resin that has transparency, such as an epoxy resin or the like, and is filled into the space portion 22. The second resin 25 seals the first resin 24.

The chip-type light emitting diode lamp 15 having the above configuration emits white light by a mixture of blue light emitted from the blue light emitting diode chip 5 and yellow light emitted from the phosphor 11.

By the way, the chip-type light emitting diode lamp 15 in this experiment includes, as the phosphor 11, a phosphor that has the same composition as the sample CYE2 mentioned above and has been sintered at 1800 degrees Celsius.

Figure 22:
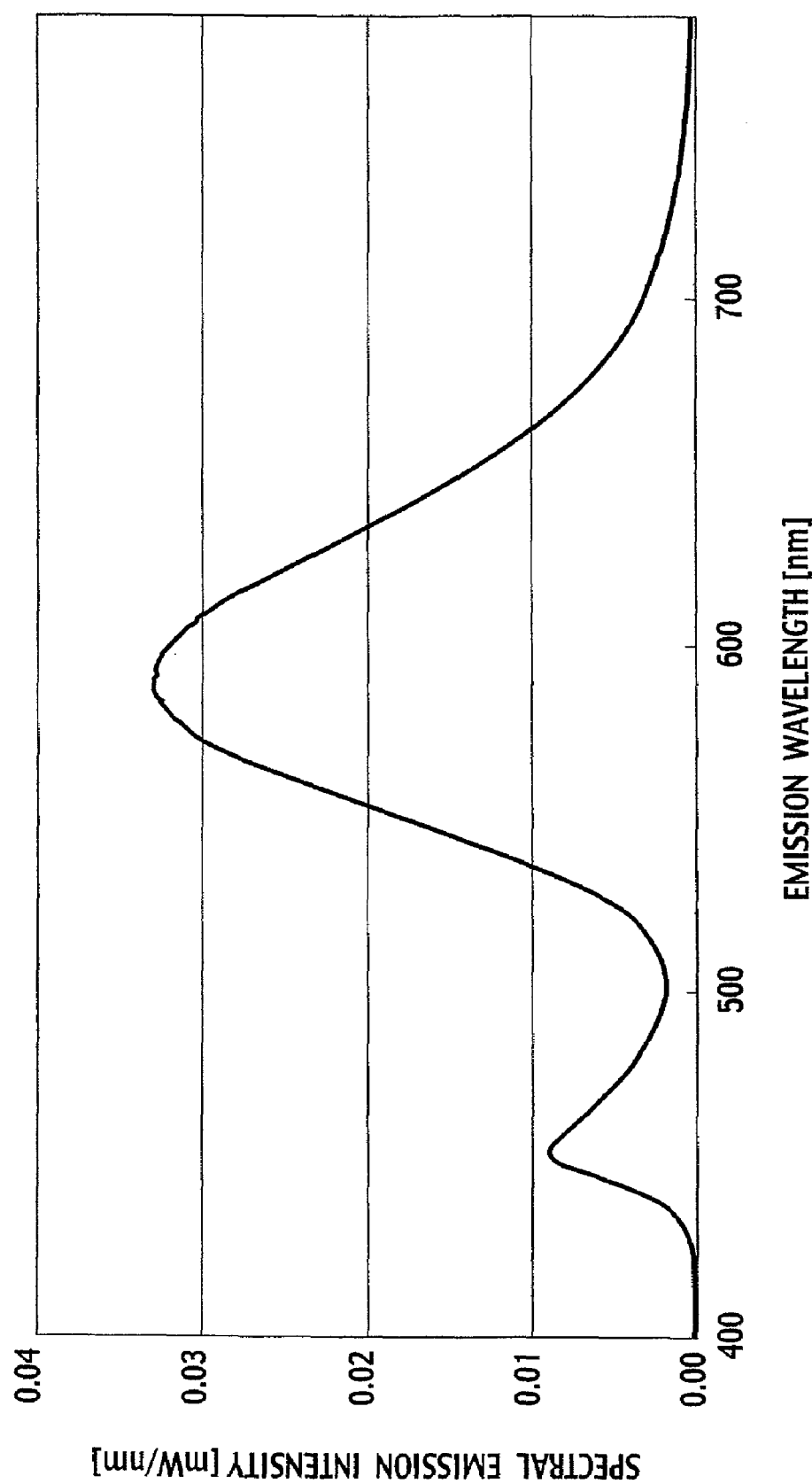
FIG. 22 illustrates an emission spectrum of the light emitting diode lamp in the fourth experiment.

Additionally, regarding the light emitted from the artillery-shell type light emitting diode lamp 1 including this phosphor 11 in this experiment, the color temperature is 2477 K, the chromaticity coordinates of (x, y) are (0.482, 0.419) in the CIE1931 color specification system, and the emission efficiency is 22.4 1 m/W (lumen per watt). The emission spectrum is as illustrated in FIG. 22.

By the way, a phosphor that has the same composition as that of the above CYE2 or CYE4 and has been sintered at 1800 degrees Celsius is applicable to the chip-type light emitting diode lamp 15 in this experiment.

(Experiment 5)

The artillery-shell type light emitting diode lamp 1 and the chip-type light emitting diode lamp 15 in the above experiment can be configured so as to include a phosphor that has the same composition as the CYE3, not the aforementioned one, and has been sintered at 1800 degrees Celsius.

Figure 9:
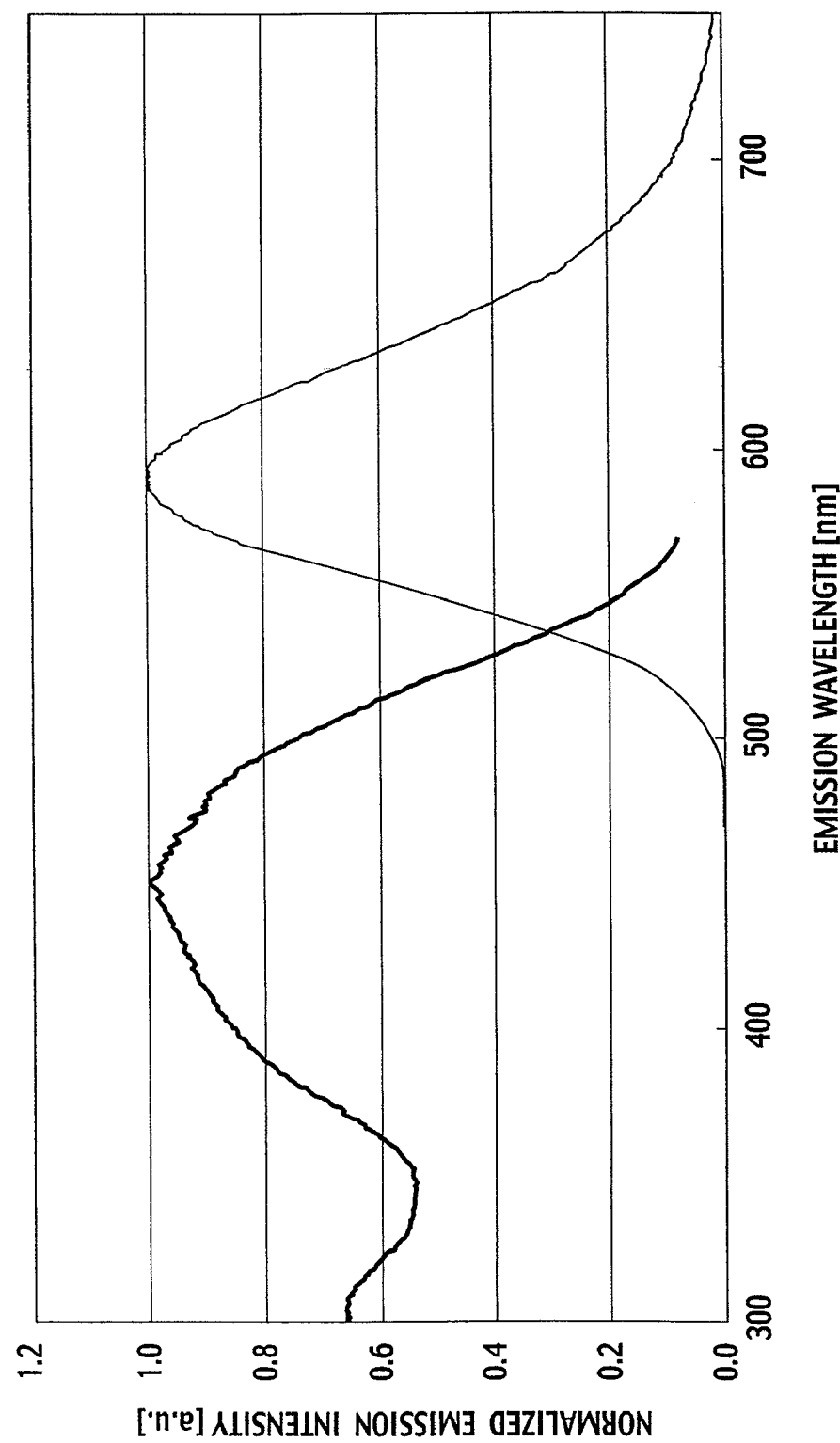
FIG. 9 illustrates excitation and emission spectra of a phosphor obtained by sintering a sample CYE3 at 1800 degrees Celsius.

The excitation and emission spectra of the above phosphor measured by a fluorescence spectrophotometer are as illustrated in FIG. 9. The 3% range width in which the excitation efficiency is 97% or larger of the excitation efficiency at the peak excitation wavelength of 449.0 nm is 8.8 nm in wavelengths shorter than the peak excitation wavelength and 8.6 nm in wavelengths longer than the peak excitation wavelength, which means that this phosphor has an excellent symmetrical property.

In addition, the emission efficiency of the phosphor is sufficiently high. Moreover, the peak emission wavelength is 591.0 nm; the dominant peak emission wavelength is 583.65 nm; and the chromaticity coordinates of (x, y) in the CIE1931 color specification system are (0.533, 0.461).

(Experiment 6)

The artillery-shell type light emitting diode lamp 1 and the chip-type light emitting diode lamp 15 in the above experiments can be configured so as to include a phosphor that has the same composition as the CYE5, not the aforementioned ones, and has been sintered at 1800 degrees Celsius.

Figure 11:
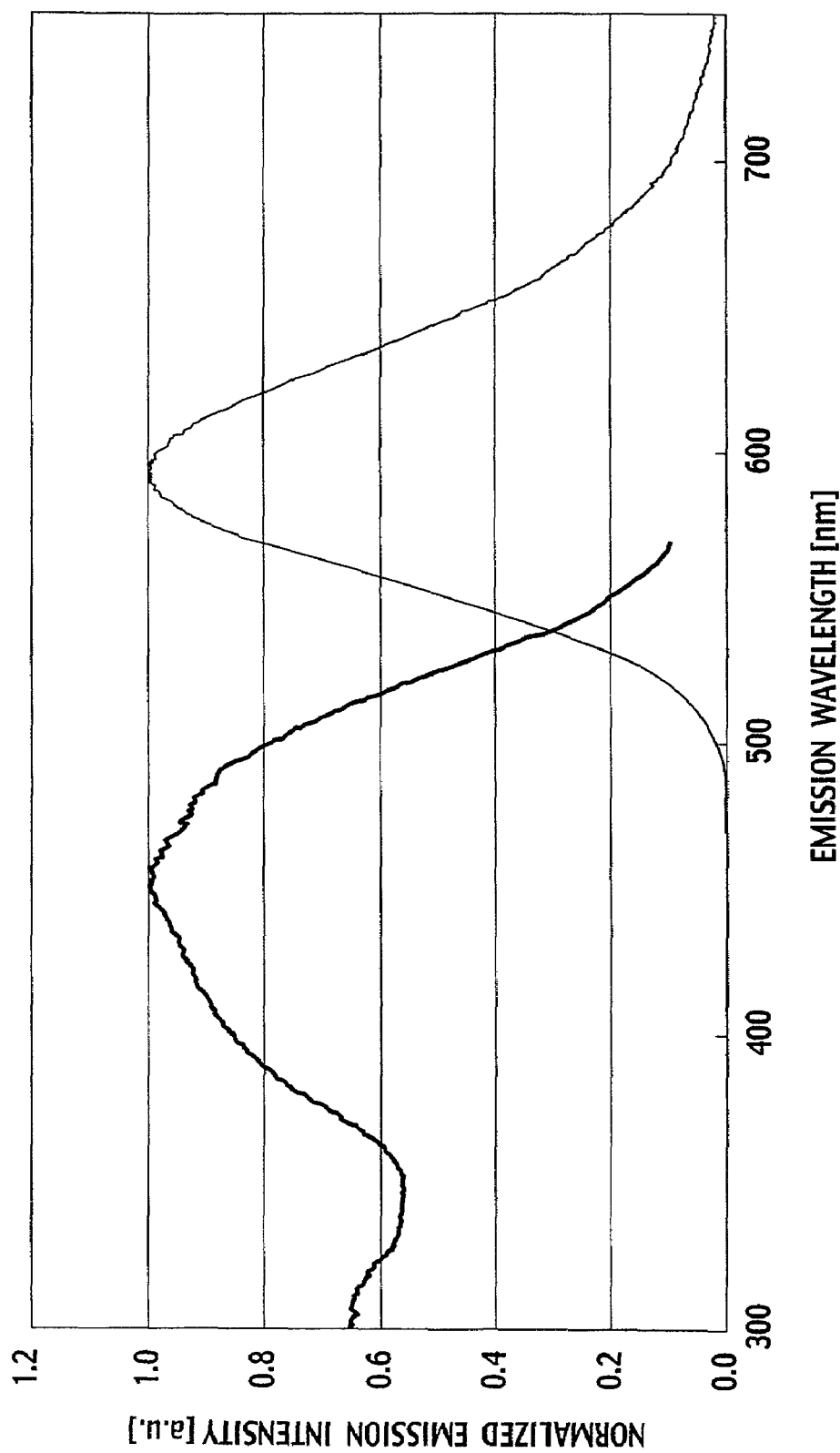
FIG. 11 illustrates excitation and emission spectra of a phosphor obtained by sintering a sample CYE5 at 1800 degrees Celsius.

The excitation and emission spectra of the above phosphor measured by a fluorescence spectrophotometer are as illustrated in FIG. 11. The 3% range width in which the excitation efficiency is 97% or larger of the excitation efficiency at the peak excitation wavelength of 447.6 nm is 9.0 nm in wavelengths shorter than the peak excitation wavelength and 15.6 nm in wavelengths longer than the peak excitation wavelength.

In addition, the emission efficiency of the phosphor is sufficiently high. Moreover, the peak emission wavelength is 591.6 nm; the dominant peak emission wavelength is 585.13 nm; and the chromaticity coordinates of (x, y) in the CIE1931 color specification system are (0.543, 0.452).

(Experiment 7)

The artillery-shell type light emitting diode lamp 1 and the chip-type light emitting diode lamp 15 in the above experiments can be configured so as to include a phosphor that has the same composition as the CYE6, not the aforementioned ones, and has been sintered at 1800 degrees Celsius.

Figure 12:
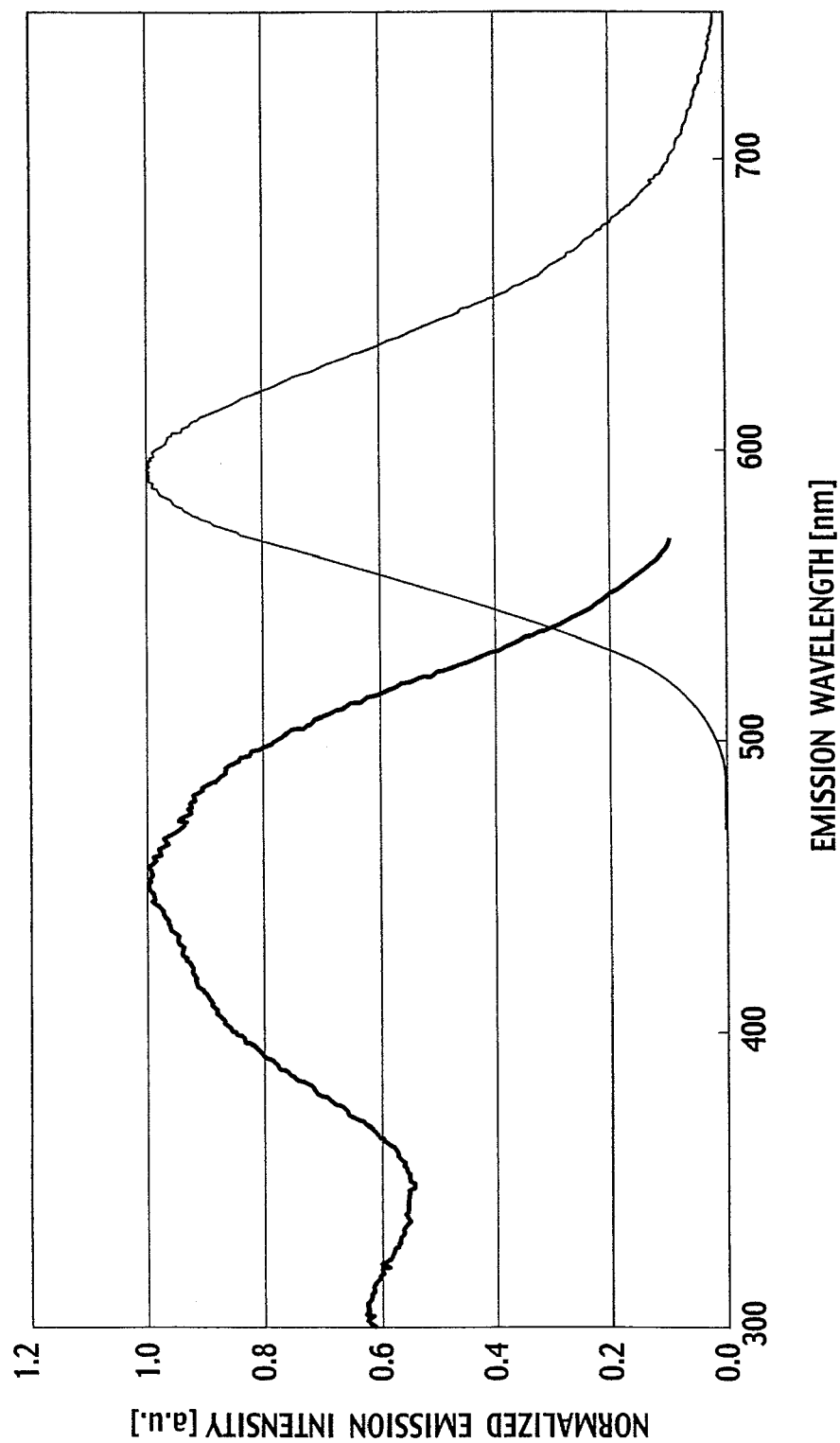
FIG. 12 illustrates excitation and emission spectra of a phosphor obtained by sintering a sample CYE6 at 1800 degrees Celsius.

The excitation and emission spectra of the above phosphor measured by a fluorescence spectrophotometer are as illustrated in FIG. 12. The 3% range width in which the excitation efficiency is 97% or larger of the excitation efficiency at the peak excitation wavelength of 448.4 nm is 8.2 nm in wavelengths shorter than the peak excitation wavelength and 12.2 nm in wavelengths longer than the peak excitation wavelength.

In addition, the emission efficiency of the phosphor is sufficiently high. Moreover, the peak emission wavelength is 592.8 nm; the dominant peak emission wavelength is 585.36 nm; and the chromaticity coordinates of (x, y) in the CIE1931 color specification system are (0.543, 0.450).

(Experiment 8)

The artillery-shell type light emitting diode lamp 1 and the chip-type light emitting diode lamp 15 in the above experiments can be configured so as to include a phosphor that has the same composition as the CYE7, not the aforementioned ones, and has been sintered at 1800 degrees Celsius.

The excitation and emission spectra of the above phosphor measured by a fluorescence spectrophotometer are as illustrated in FIG. 13. The 3% range width in which the excitation efficiency is 97% or larger of the excitation efficiency at the peak excitation wavelength of 449.0 nm is 38.8 nm in wavelengths shorter than the peak excitation wavelength and 8.4 nm in wavelengths longer than the peak excitation wavelength.

In addition, the emission efficiency of the phosphor is sufficiently high. Moreover, the peak emission wavelength is 598.6 nm; the dominant peak emission wavelength is 586.39 nm; and the chromaticity coordinates of (x, y) in the CIE1931 color specification system are (0.549, 0.444).

(Experiment 9)

The artillery-shell type light emitting diode lamp 1 and the chip-type light emitting diode lamp 15 in the above experiments can be configured so as to include a phosphor that has the same composition as the CYE8, not the aforementioned ones, and has been sintered at 1800 degrees Celsius.

The excitation and emission spectra of the above phosphor measured by a fluorescence spectrophotometer are as illustrated in FIG. 14. The 3% range width in which the excitation efficiency is 97% or larger of the excitation efficiency at the peak excitation wavelength of 438.6 nm has 31.0 nm in wavelengths shorter than the peak excitation wavelength and 14.8 nm in wavelengths longer than the peak excitation wavelength.

In addition, the emission efficiency of the phosphor is sufficiently high. Moreover, the peak emission wavelength is 601.4 nm; the dominant peak emission wavelength is 587.53 nm; and the chromaticity coordinates of (x, y) in the CIE1931 color specification system are (0.556, 0.437).

As above, according to the present invention, it becomes possible to alleviate an abrupt reduction in emission efficiency in wavelengths longer than the peak excitation wavelength by substituting Y for 15% or less of Ca in Eu-activated Ca-alpha-SiAlON phosphor as a high efficiency oxynitride yellow phosphor without sacrificing its high emission efficiency. In addition, with this phosphor, it becomes possible to fabricate a light emitting device that realizes reduced variations compared with the conventional ones, the light emitting device using a blue light emitting diode chip and the above phosphor, even when there are wavelength variations in the blue light emitting diode chip. Moreover, even when a wavelength-shift toward longer wavelengths takes place in the blue light emitting diode chip, the chromaticity-shift in the light emitting device can be reduced compared with the conventional ones.

Furthermore, there is obtained a phosphor that has a sufficiently high emission efficiency and an excitation spectrum having substantially a symmetric shape, that is, substantially the same shape in both longer and shorter wavelengths with the peak excitation wavelength at center, in the vicinity thereof by substituting Y for from 15% to 35% of Ca in Eu-activated Ca-alpha-SiAlON phosphor as a high efficiency oxynitride yellow phosphor. Moreover, with this phosphor, it becomes possible to fabricate a light emitting device that realizes further reduced variations compared with the conventional ones, the light emitting device using a blue light emitting diode chip and the above phosphor, even when there are wavelength variations in the blue light emitting diode chip. Moreover, even when a wavelength-shift toward longer wavelengths takes place in the blue light emitting diode chip, the chromaticity-shift in the light emitting device can be further reduced compared with the conventional ones.

Furthermore, it becomes possible to realize the phosphor that can be excited by blue light and emit light having the dominant peak wavelength of from 580 nm to 590 nm by substituting Y for an appropriate amount of from 0 to 100% of Ca in Eu-activated Ca-alpha-SiAlON phosphor as the high efficiency phosphor and by appropriately controlling a sintering temperature of from 1700 to 1900 degrees Celsius. In addition, since an oxide can be used as a source material of Eu and Y to realize the above phosphor, an expensive rare-earth nitride raw material is not required to use, thereby reducing costs.

Although the present invention has been described in reference with the foregoing specific examples, other alternatives, variations and modifications will be apparent to one of those skilled in the art. Those alternatives, variations and modifications are intended to fall within the spirit and scope of the appended claims.

What is claimed is:

1. An oxynitride phosphor represented by a general formula of $(Ca_{1-z}Y_z)_x(Si, Al)_{12}(O, N)_{16}:Eu^{2+}_y$,
   wherein a main phase thereof has substantially an alpha SiAlON crystal structure; the value z is larger than 0 and smaller than 0.15;
   the value x is from 0.75 to 1.00; and
   the value y is from 0.03 to 0.08.

2. A light emitting device comprising:
   a phosphor as recited in claim 1, and
   a semiconductor blue light emitting diode chip.

3. A light emitting device as recited in claim 2, wherein a center emission wavelength of the semiconductor blue light emitting diode chip is from 430 nm to 463 nm.

4. A light emitting device as recited in claim 3, wherein a center emission wavelength of the semiconductor blue light emitting diode chip is from 440 nm to 456 nm.

5. An oxynitride phosphor represented by a general formula of $(Ca_{1-z}Y_z)_x(Si, Al)_{12}(O, N)_{16}:Eu^{2+}_y$,
   wherein a main phase thereof has substantially an alpha SiAlON crystal structure,
   the value z is from 0.15 to 0.35;
   the value x is from 0.75 to 1.00; and
   the value y is from 0.03 to 0.08.

6. A light emitting device comprising:
   a phosphor as recited in claim 5, and
   a semiconductor blue light emitting diode chip.

7. A light emitting device as recited in claim 6, wherein a center emission wavelength of the semiconductor blue light emitting diode chip is from 434 nm to 464 nm.

8. A light emitting device as recited in claim 7, wherein a center emission wavelength of the semiconductor blue light emitting diode chip is from 440 nm to 458 nm.

9. An oxynitride phosphor represented by a general formula of $(Ca_{1-z}Y_z)_x(Si, Al)_{12}(O, N)_{16}:Eu^{2+}_y$,
   wherein a main phase thereof has substantially an alpha-SiAlON crystal structure;
   the value x is from 0.75 to 1.00;
   the value y is from 0.03 to 0.08;
   the value z is from 0 to 1.00;
   the oxynitride phosphor is sintered at a sintering temperature of from 1650 degrees Celsius to 1750 degrees Celsius under a pressurized nitrogen atmosphere; and
   a dominant emission wavelength is from 580 nm to 585 nm.

10. An oxynitride phosphor represented by a general formula of $(Ca_{1-z}Y_z)_x(Si, Al)_{12}(O, N)_{16}:Eu^{2+}_y$,
    wherein a main phase thereof has substantially an alpha-SiAlON crystal structure;
    the value x is from 0.75 to 1.00;
    the value y is from 0.03 to 0.08;
    the value z is from 0 to 1.00;
    the oxynitride phosphor is sintered at a sintering temperature of from 1750 degrees Celsius to 1850 degrees Celsius under a pressurized nitrogen atmosphere; and
    a dominant emission wavelength is from 583 nm to 588 nm.

11. An oxynitride phosphor represented by a general formula of $(Ca_{1-z}Y_z)_x(Si, Al)_{12}(O, N)_{16}:Eu^{2+}_y$,
    wherein a main phase thereof has substantially an alpha-SiAlON crystal structure;
    the value x is from 0.75 to 1.00;
    the value y is from 0.03 to 0.08;
    the value z is from 0 to 1.00;
    the oxynitride phosphor is sintered at a sintering temperature of from 1850 degrees Celsius to 1950 degrees Celsius under a pressurized nitrogen atmosphere; and
    a dominant emission wavelength is from 585 nm to 590 nm.

12. A light emitting device comprising:
    a phosphor as recited in claim 9, and
    a semiconductor blue light emitting diode chip.

13. A light emitting device comprising:
    a phosphor as recited in claim 10, and
    a semiconductor blue light emitting diode chip.

14. A light emitting device comprising:
    a phosphor as recited in claim 11, and
    a semiconductor blue light emitting diode chip.

* * * * *

UNITED STATES PATENT AND TRADEMARK OFFICE
CERTIFICATE OF CORRECTION

| | | |
|---|---|---|
| PATENT NO. | : 7,597,821 B2 | Page 1 of 1 |
| APPLICATION NO. | : 11/212559 | |
| DATED | : October 6, 2009 | |
| INVENTOR(S) | : Sakuma et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 541 days.

Signed and Sealed this

Twenty-eighth Day of September, 2010

David J. Kappos
*Director of the United States Patent and Trademark Office*